(12) United States Patent
Yamagishi et al.

(10) Patent No.: US 8,377,625 B2
(45) Date of Patent: Feb. 19, 2013

(54) METHOD FOR PRODUCING A COPOLYMER SOLUTION WITH A UNIFORM CONCENTRATION FOR SEMICONDUCTOR LITHOGRAPHY

(75) Inventors: Takanori Yamagishi, Funabashi (JP); Ichiro Kato, Chiba (JP); Akiko Tanaka, Sodegaura (JP); Miyako Asano, Ichihara (JP)

(73) Assignee: Maruzen Petrochemical Co., Ltd., Chuo-Ku (JP)

( * ) Notice: Subject to any disclaimer, the term of this patent is extended or adjusted under 35 U.S.C. 154(b) by 435 days.

(21) Appl. No.: 12/607,324

(22) Filed: Oct. 28, 2009

(65) Prior Publication Data

US 2010/0143842 A1 Jun. 10, 2010

(30) Foreign Application Priority Data

Oct. 30, 2008 (JP) ................. 2008-280241

(51) Int. Cl.
*G03F 7/00* (2006.01)

(52) U.S. Cl. ............... 430/270.1; 526/319; 526/266; 526/286; 526/72; 438/496; 438/780

(58) Field of Classification Search .......... 526/319, 526/266, 286, 72; 430/270.1; 438/496, 780
See application file for complete search history.

(56) References Cited

U.S. PATENT DOCUMENTS

| | | | |
|---|---|---|---|
| 4,603,101 A | 7/1986 | Crivello | |
| 5,118,585 A | 6/1992 | Schwalm et al. | |
| 5,621,019 A | 4/1997 | Nakano et al. | |
| 6,489,432 B2 | 12/2002 | Jung et al. | |
| 2001/0043992 A1 | 11/2001 | Jung et al. | |
| 2007/0111137 A1 | 5/2007 | Yamagishi et al. | |
| 2007/0269741 A1* | 11/2007 | Iijima et al. | 430/270.1 |
| 2009/0306328 A1* | 12/2009 | Yamagishi et al. | 528/272 |

FOREIGN PATENT DOCUMENTS

| | | | |
|---|---|---|---|
| JP | 59-045439 A | | 3/1984 |
| JP | 62-115440 A | | 5/1987 |
| JP | 05-113667 A | | 5/1993 |
| JP | 07-252324 A | | 10/1995 |
| JP | 09-073173 A | | 3/1997 |
| JP | 09-090637 A | | 4/1997 |
| JP | 10-026828 A | | 1/1998 |
| JP | 10-161313 A | | 6/1998 |
| JP | 10-207069 A | | 8/1998 |
| JP | 2000-026446 A | | 1/2000 |
| JP | 2000-137327 A | | 5/2000 |
| JP | 2000-313779 A | | 11/2000 |
| JP | 2000-330287 A | | 11/2000 |
| JP | 2001-027810 A | | 1/2001 |
| JP | 2001-109154 A | | 4/2001 |
| JP | 2001-192411 A | | 7/2001 |
| JP | 2001-226324 A | | 8/2001 |
| JP | 2001-242627 A | | 9/2001 |
| JP | 2003-057828 A | | 2/2003 |
| JP | 2005-173252 A | | 6/2005 |
| JP | 2006-161052 A | | 6/2006 |
| JP | 2006-193687 A | | 7/2006 |
| JP | 2006-243308 A | | 9/2006 |
| JP | 2007-146020 A | | 6/2007 |
| JP | 2007-148328 A | | 6/2007 |
| WO | WO2008068903 | * | 6/2008 |

OTHER PUBLICATIONS

Experiments in Organic Chemistry by Fieser 2nd Ed. 1941.*

* cited by examiner

*Primary Examiner* — Mark Kaucher
(74) *Attorney, Agent, or Firm* — Burr & Brown

(57) ABSTRACT

A method of producing a copolymer solution for semiconductor lithography having a copolymer and a solvent for coating film formation, which copolymer contains at least one repeating unit selected from the group consisting of: a repeating unit (A) having a hydroxyl group; a repeating unit (B) having a structure in which a hydroxyl group is protected by a group which suppresses dissolution into an alkaline developer and which dissociates in the action of an acid; a repeating unit (C) having a lactone structure; and a repeating unit (D) having a cyclic ether structure, the difference in the copolymer concentration among a plurality of containers which were filled with copolymer solution from the same manufacturing lot is not more than a certain range, or the method includes a certain production step.

11 Claims, No Drawings

_METHOD FOR PRODUCING A COPOLYMER SOLUTION WITH A UNIFORM CONCENTRATION FOR SEMICONDUCTOR LITHOGRAPHY_

FIELD OF THE INVENTION

The present invention relates to a method of producing a copolymer solution used in a lithography process of semiconductor fabrication. More specifically, the present invention relates to a method of producing a copolymer solution used in the formation of thin films, such as a resist film used in a lithography process of semiconductor fabrication and anti-reflection film, gap-fill film and topcoat film which are formed above or below a resist film.

BACKGROUND OF THE INVENTION

In fabrication of semiconductor elements, there is a demand for the formation of a finer pattern by lithography in order to increase the degree of integration. As a method of the miniaturization, a source of radiation (light) having a short wavelength (hereinafter, light is also regarded as a form of radiation) is indispensable, and in addition to conventional g-line and i-line, far-ultraviolet rays such as krypton fluoride (KrF) excimer laser (wavelength of 248 nm) and argon fluoride (ArF) excimer laser (wavelength of 193 nm) have been introduced in mass-production. Further, there also have been studies on lithography techniques in which fluorine dimer ($F_2$) excimer laser (157 nm), extreme ultraviolet rays (EUV), electron beam (EB) or the like is used as the radiation source.

A composition for lithography is used in these lithography techniques to form a resist film for transferring a pattern onto a substrate. In addition, a composition for lithography may be used as required to form various thin films above or below a resist film. These compositions are solutions in which polymers and additives having respective target functions are dissolved in an organic solvent. The composition solution is dispensed onto the substrate by a method such as spin coating and the resultant is then heated to remove the solvent, thereby forming a thin film for lithography.

The compositions for lithography used in the formation of a resist film (hereinafter, may be referred to as "resist film forming agent") are classified into positive type whose part exposed to radiation dissolves in a developer and negative type whose part not exposed to radiation dissolves in a developer. A type which comprises a compound whose solubility in a developer changes by the action of radiation and polymers soluble in an alkaline developer, and a type which comprises a compound that generates an acid by the action of radiation and copolymers whose solubility in an alkaline developer changes by the action of an acid are known. The latter type is specifically called chemically amplified resist and among such resists, chemically amplified positive resists are especially preferably used in microfabrication.

As a composition for lithography to form a thin film above or below a resist film, for example, an anti-reflection film forming agent which is applied onto high-reflection substrate surface (below a resist film) and/or the surface of a resist film (above a resist film) to reduce the reflection in the resist film interface and to suppress a standing wave, thereby precisely forming a fine resist pattern; a gap-fill film forming agent which is applied onto the substrate surface (below the resist film and/or anti-reflection film) when a resist pattern is further formed on the substrate onto which a pattern has already been formed, thereby filling the gaps on the substrate surface for planarization; and topcoat film forming agent which is applied onto a resist film to suppress the penetration of the immersion solution into the resist film and the elution of the radiation-sensitive acid generator and the like in liquid immersion photolithography are known.

In the above-described composition solutions for the formation of a thin film, copolymers for lithography are important constituents in which optical properties, chemical properties and physical properties are demanded for the expression of respective functions of thin films, and they are now widely studied. For example, for chemically amplified positive resist film forming agent which utilizes KrF excimer laser, copolymers having a repeating unit originated from hydroxy styrene and a repeating unit in which phenolic hydroxyl group originated from hydroxy styrene is protected by a group such as an acetal structure or tertiary hydrocarbon group, which group inhibits dissolution in an alkaline developer and also dissociates by the action of an acid (hereinafter, may be referred to as "acid-dissociable dissolution-inhibiting group"), or a repeating unit in which carboxyl group originated from (α-alkyl)acrylic acid is protected by an acid-dissociable dissolution-inhibiting group such as an acetal structure or tertiary hydrocarbon group, are known (see, for example, Patent Literatures 1-4). Further, copolymers having a repeating unit in which alicyclic hydrocarbon group was made an acid-dissociable dissolution-inhibiting group in order to improve the resistance to dry etching and the difference in the dissolution rates of copolymers in an alkaline developer before and after the exposure are known (see, for example, Patent Literatures 5-6).

As for chemically amplified positive resist film forming agent which utilizes ArF excimer laser, copolymers not having a repeating unit originated from hydroxy styrene, which has a high extinction coefficient for the wavelength of 193 nm, have been examined. Copolymers having a lactone structure in the repeating unit (see, for example, Patent Literatures 7-10) and those having a hydroxyl group in the repeating unit (see, for example, Patent Literatures 11-14), which lactone structure and hydroxyl group are contained as a polar group to improve the adhesiveness to a semiconductor substrate or the like and to control the solubility in a lithography solvent or alkaline developer, are known.

For anti-reflection film forming agent, the copolymers comprising a repeating unit having an aromatic ring such as benzene ring, naphthalene ring or anthracene ring as a functional group which increases the extinction coefficient and refractive index to the wavelength of 248 nm and 193 nm, and a repeating unit having a reactive functional group as required, which reactive functional group such as amino group, amide group, hydroxyl group or epoxy group can be cured upon reacting with a curing agent or the like to avoid mixing with resist film (see, for example, Patent Literatures 15-18), are known.

For gap-fill film forming agent, copolymers comprising a repeating unit having an appropriate viscosity to flow into a narrow gap and a reactive functional group which can be cured upon reacting with a curing agent or the like to avoid mixing with resist film and anti-reflection film are known. Specifically, the copolymer comprising a repeating unit which is originated from hydroxy styrene and as required, a repeating unit which is originated from a polymerizable monomer such as styrene, alkyl(meth)acrylate or hydroxyalkyl(meth)acrylate is known (see, for example, Patent Literature 19).

For topcoat film forming agent in immersion lithography, the copolymer comprising a repeating unit having a carboxyl group (see, for example, Patent Literature 20), the copolymer comprising a repeating unit having a fluorine-containing group which is substituted by a hydroxyl group (see, for example, Patent Literature 21) and the like are known.

It is not preferred to make these copolymers dry solid during the production of the copolymer since there are effects such as partial elimination of an acid-dissociable dissolution-inhibiting group due to undue heat load on the copolymers. Therefore, a method in which copolymers are re-dissolved in a good solvent having a boiling point lower than that of the solvent for coating film formation without drying the copolymers from the state of wet cake or the like, and the resulting solution is heated under reduced pressure while adding thereto a solvent for coating film formation to distill off a part of the solvent for coating film formation and components having a low boiling point, so that a copolymer solution in which components having a low boiling point are reduced is obtained (see Patent Literature 22); and a method in which the copolymers are re-dissolved in the solvent for coating film formation from the state of wet cake and the resulting solution is heated under reduced pressure to be concentrated, so that a copolymer solution in which components having a low boiling point are reduced is obtained (see Patent Literatures 23-25), are known.

However, it was not known that, in a copolymer solution produced by such methods, the copolymer concentration varies among a plurality of product containers even if the containers are filled with copolymer solution from the same production lot. Therefore, the film thickness and lithography properties of lithography thin film vary when such a copolymer solution is used as a lithography composition, which has been a major obstacle to the demand for further miniaturization of lithography patterns.

Patent Literature 1: JP S59-045439 A
Patent Literature 2: JP H05-113667 A
Patent Literature 3: JP H10-026828 A
Patent Literature 4: JP S62-115440 A
Patent Literature 5: JP H09-073173 A
Patent Literature 6: JP H10-161313 A
Patent Literature 7: JP H09-090637 A
Patent Literature 8: JP H10-207069 A
Patent Literature 9: JP 2000-026446 A
Patent Literature 10: JP 2001-242627 A
Patent Literature 11: JP H07-252324 A
Patent Literature 12: JP 2000-137327 A
Patent Literature 13: JP 2000-330287 A
Patent Literature 14: JP 2001-109154 A
Patent Literature 15: JP 2000-313779 A
Patent Literature 16: JP 2001-27810 A
Patent Literature 17: JP 2001-192411 A
Patent Literature 18: JP 2001-226324 A
Patent Literature 19: JP 2003-57828 A
Patent Literature 20: JP 2006-193687 A
Patent Literature 21: JP 2006-243308 A
Patent Literature 22: JP 2005-173252 A
Patent Literature 23: JP 2006-161052 A
Patent Literature 24: JP 2007-148328 A
Patent Literature 25: JP 2007-146020 A

SUMMARY OF THE INVENTION

Problems to be Solved by the Invention

The present invention was made in view of the above-described background art and an object of the present invention is to provide a method of producing a copolymer solution for semiconductor lithography having an extremely small deviation in the film thickness and lithography properties in a resist film used in semiconductor lithography and anti-reflection film, gap-fill film and topcoat film which are formed above or below a resist film.

Means for Solving the Problems

In order to solve the above-described problems, the present inventors intensively studied to find out that the above-described problems can be solved by making the range of the copolymer concentration in each of a plurality of containers filled with a copolymer solution from the same production lot not more than a specific range, and by employing a production method comprising specific production steps, thereby completing the present invention.

That is, the first object of the present invention is to provide a method of producing a copolymer solution for semiconductor lithography, which method comprises a Step (S) in which a copolymer solution comprising: a copolymer which contains at least one repeating unit selected from the group consisting of a repeating unit (A) having a hydroxyl group; a repeating unit (B) having a structure in which a hydroxyl group is protected by a group that suppresses the dissolution in an alkaline developer and dissociates by the action of an acid; a repeating unit (C) having a lactone structure; and a repeating unit (D) having a cyclic ether structure; and a solvent for coating film formation, is heated under reduced pressure to distill off impurities having a boiling point lower than that of the solvent for coating film formation, and in which method the difference between the maximum and minimum values of the copolymer concentration among a plurality of containers is not more than 1.5% of the maximum concentration when the containers are filled with copolymer solution from the same production lot.

Further, the second object of the present invention to provide a method of producing a copolymer solution for semiconductor lithography, which method comprises a Step (S) in which a copolymer solution comprising: a copolymer which contains at least one repeating unit selected from the group consisting of a repeating (A) unit having a hydroxyl group, a repeating unit (B) having a structure in which a hydroxyl group is protected by a group that suppresses the dissolution in an alkaline developer and dissociates by the action of an acid, a repeating unit (C) having a lactone structure and a repeating unit (D) having a cyclic ether structure; and a solvent for coating film formation, is heated under reduced pressure to distill off impurities having a boiling point lower than that of the solvent for the coating film formation, and which method comprises a Step (U) in which a bath different from that of the Step (S) is used to stir the copolymer solution obtained via the Step (S).

Effects of the Invention

By using the copolymer solution obtained by the method according to the present invention, an extremely small deviation in the film thickness and lithography properties can be attained, so that a highly-integrated semiconductor element which requires a fine lithography pattern can be produced at a high yield.

DETAILED DESCRIPTION OF THE INVENTION

Hereinafter, the present invention will be explained in more detail.

1. Copolymer Structure

A copolymer contained in the copolymer solution which is produced according to the method of the present invention contains at least one repeating unit selected from the group consisting of a repeating unit (A) having a hydroxyl group; a repeating unit (B) having a structure in which a hydroxyl group is protected by an acid-dissociable dissolution-inhibiting group; a repeating unit (C) having a lactone structure; and a repeating unit (D) having a cyclic ether structure. Further, as required, the copolymer may comprise a repeating unit (E) having a structure which suppresses dissolution in an alkaline developer and is stable against the action of an acid (hereinafter, may be referred to as "acid-stable dissolution inhibiting structure"). These repeating units may be selected according to the purpose of the thin film used in semiconductor lithography.

For example, when used for a chemically amplified positive resist film, the copolymer always comprises the repeating unit (B) and at least one repeating unit selected from the group consisting of the repeating units (A) and (C) and may comprise the repeating unit (E) as required. When used for a negative resist film, the copolymer always comprises at least one repeating unit selected from the group consisting of the repeating units (A) and (D) and may contain, as required, at least one repeating unit selected from the group consisting of the repeating units (C) and (E). When used for an anti-reflection film or topcoat film for immersion, the copolymer always comprises at least one repeating unit selected from the group consisting of the repeating units (A) and (D) and may comprise, as required, at least one repeating unit selected from the group consisting of the repeating units (B), (C) and (E).

(1) Repeating Unit (A)

The repeating unit (A) is a repeating unit having a hydroxyl group and has a function to increase the adhesiveness to a substrate and base film, to control the solubility in a lithography solvent and alkaline developer, and to react with a curing agent to form a cross-linked structure. Examples of the hydroxyl group include a hydroxyl group which bonds to linear, branched or cyclic hydrocarbon group which may be substituted with halogen. Another examples of the hydroxyl group include a hydroxyl group which bonds to carbonyl group, sulfonyl group or the like. Specific examples include, an alcoholic hydroxyl group, phenolic hydroxyl group, fluoroalcoholic hydroxyl group, carboxyl group and sulfo group, and it is preferred that the hydroxyl group be alcoholic hydroxyl group, phenolic hydroxyl group, fluoroalcoholic hydroxyl group or carboxyl group.

As the structure of repeating unit (A), the structures represented by Formulae (A1) to (A3) are especially preferred.

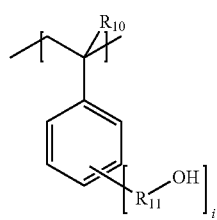
(A1)

In Formula (A1), $R_{10}$ represents a hydrogen atom or $C_1$-$C_4$ hydrocarbon group which may be substituted with one or more fluorine atom. Specific examples of $R_{10}$ include a hydrogen and $C_1$-$C_4$ alkyl group which may be substituted with one or more fluorine atom, such as methyl group, ethyl group, n-propyl group, i-propyl group, n-butyl group, i-butyl group or trifluoromethyl group, and $R_{10}$ is preferably a hydrogen atom, methyl group or trifluoromethyl group. $R_{11}$ represents a single bond or a divalent $C_1$-$C_4$ hydrocarbon group which may be substituted with one or more fluorine atom. Specific examples of $R_{11}$ include a single bond and $C_1$-$C_4$ alkylene group which may be substituted with one or more fluorine atom, such as methylene group, 1,1-ethylene group, 2,2-propylene group, 1,1,1,3,3,3-hexafluoro-2,2-propylene group or 1,1,1-trifluoro-2-trifluoromethyl-2,3-propylene group, and $R_{11}$ is preferably a single bond, 1,1,1,3,3,3-hexafluoro-2,2-propylene group or 1,1,1-trifluoro-2-trifluoromethyl-2,3-propylene group and especially preferably a single bond. The "i" represents an integer of 1 or 2.

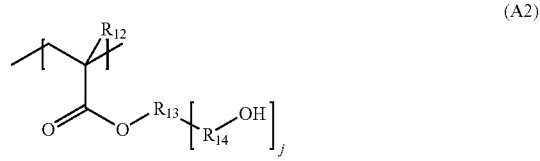
(A2)

In Formula (A2), $R_{12}$ represents a hydrogen atom or $C_1$-$C_4$ hydrocarbon group which may be substituted with one or more fluorine atom. Specific examples of $R_{12}$ include a hydrogen atom and $C_1$-$C_4$ alkyl group which may be substituted with one or more fluorine atom, such as methyl group, ethyl group, n-propyl group, i-propyl group, n-butyl group, i-butyl group, trifluoromethyl group, and $R_{12}$ is preferably a hydrogen atom, methyl group or trifluoromethyl group. $R_{13}$ represents a divalent-tetravalent $C_2$-$C_{12}$ hydrocarbon group which may contain one or more fluorine atom, oxygen atom or sulfur atom. Specific examples of $R_{13}$ include a linear or branched saturated hydrocarbon group such as ethylene group or isopropylene group and a saturated alicyclic hydrocarbon group having a ring such as cyclohexane ring, norbornane ring, 7-oxa-norbornane ring, 7-thia-norbornane ring, adamantane ring or tetracyclo[4.4.0.1$^{2,5}$.1$^{7,10}$]dodecane ring, and the ring is preferably a cyclohexane ring, norbornane ring or adamantane ring. $R_{14}$ represents a single bond or divalent $C_1$-$C_4$ hydrocarbon group which may be substituted with one or more fluorine atom. Specific examples of $R_{14}$ include a single bond and $C_1$-$C_4$ alkylene group which may be substituted with one or more fluorine atom, such as methylene group, 11-ethylene group, 2,2-propylene group, 1,1,1,3,3,3-hexafluoro-2,2-propylene group or 1,1,1-trifluoro-2-trifluoromethyl-2,3-propylene group, and $R_{14}$ is preferably a single bond, 1,1,1,3,3,3-hexafluoro-2,2-propylene group or 1,14-trifluoro-2-trifluoromethyl-2,3-propylene group. The combination in which $R_{13}$ is an adamantyl group and $R_{14}$ is a single bond is especially preferred. The "j" represents an integer of 1 to 3.

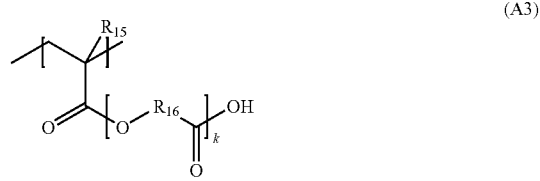
(A3)

In Formula (A3), $R_{15}$ represents a hydrogen atom or $C_1$-$C_4$ hydrocarbon group which may be substituted with one or more fluorine atom. Specific examples of $R_{15}$ include a hydrogen atom or $C_1$-$C_4$ alkyl group which may be substituted with one or more fluorine atom, such as methyl group, ethyl group, n-propyl group, i-propyl group, n-butyl group, i-butyl group or trifluoromethyl group, and $R_{15}$ is preferably a hydrogen atom, methyl group or trifluoromethyl group. $R_{16}$ represents a divalent $C_6$-$C_{12}$ alicyclic hydrocarbon group which may contain an oxygen atom or sulfur atom. Specific examples of $R_{16}$ include a saturated alicyclic hydrocarbon group having a ring such as norbornane ring, 7-oxa-norbornane ring, 7-thia-norbornane ring or tetracyclo[4.4.0.1$^{2,5}$.1$^{7,10}$]dodecane ring, and the ring is preferably a norbornane ring or tetracyclo[4.4.0.1$^{2,5}$.1$^{7,10}$]dodecane ring. The "k" represents an integer of 0 or 1.

Specific examples of the repeating unit (A) will now be described in the following; however, the present invention is not restricted thereto. Among the following repeating unit (A)s, one or a plurality of the following structures may be selected and used.

(A101)
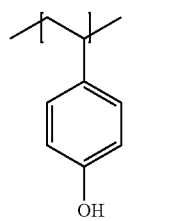

(A102)
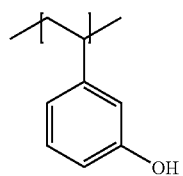

(A103)
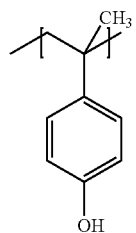

(A103)
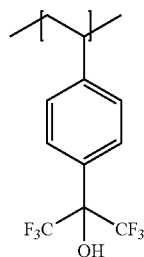

(A104)
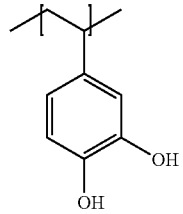

(A201)
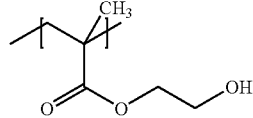

-continued (A202)
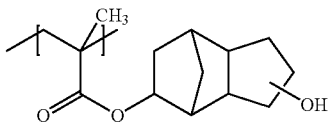

(A211)
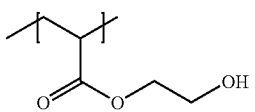

(A203)
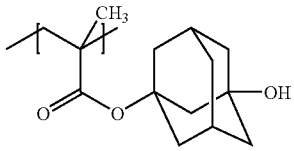

(A204)
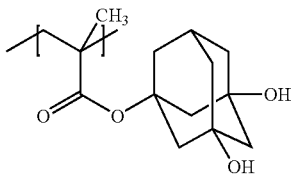

(A205)
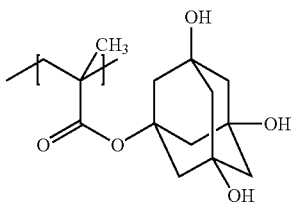

(A206)
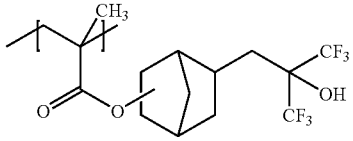

(A207)
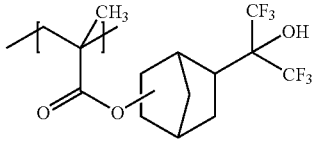

(A208)
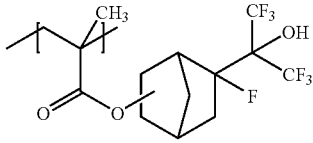

(A209)
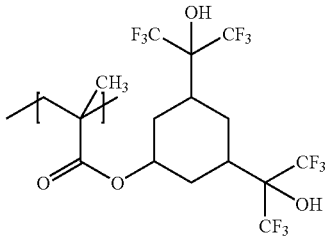

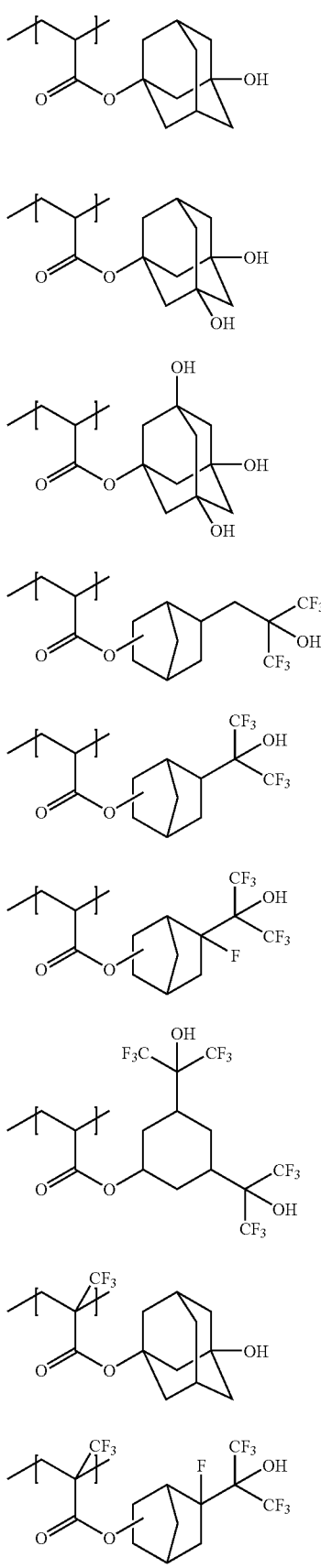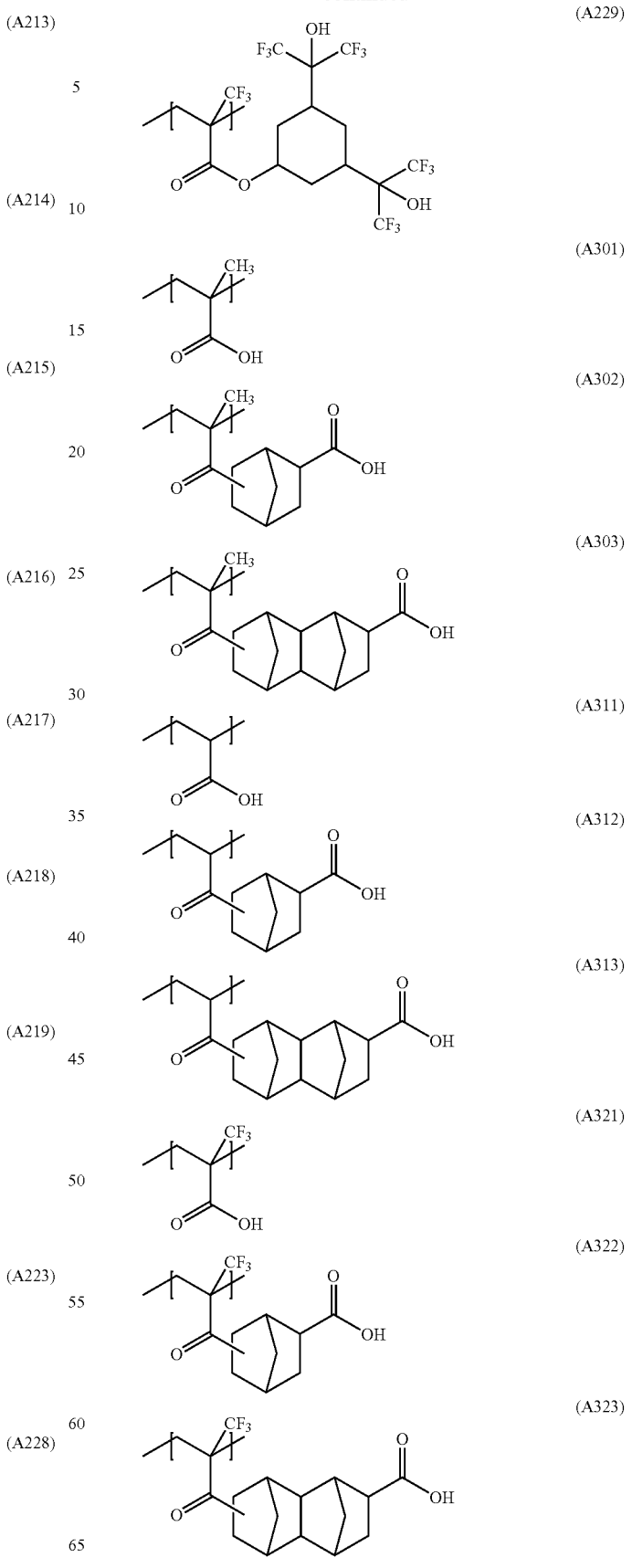

(2) Repeating Unit (B)

The repeating unit (B) is a repeating unit having a structure formed by protecting the hydroxy group with an acid-dissociable dissolution-inhibiting group and has a function to change the solubility of copolymers in an alkaline developer. Preferable examples of the repeating unit (B) include a structure in which hydroxyl group having the structure represented by Formulae (A1) to (A3) is protected by the acid-dissociable dissolution-inhibiting group represented by Formula (b1) or (b2).

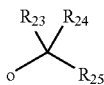

(b1)

In Formula (b1), o represents the binding site of Formula (b1). $R_{23}$ and $R_{24}$ independently represent a $C_1$-$C_4$ hydrocarbon group and specific examples thereof include a $C_1$-$C_4$ alkyl group such as methyl group, ethyl group, n-propyl group, i-propyl group, n-butyl group or i-butyl group. $R_{25}$ represents a $C_1$-$C_{12}$ hydrocarbon group and specific examples thereof include a linear, branched or cyclic $C_1$-$C_{12}$ alkyl group such as methyl group, ethyl group, n-propyl group, i-propyl group, n-butyl group, i-butyl group, cyclopentyl group, cyclohexyl group, norbornyl group, tricyclo[5.2.1.0$^{2,6}$]decanyl group, adamantyl group or tetracyclo[4.4.0.1$^{2,5}$.1$^{7,10}$]dodecanyl group. $R_{25}$ may make a bond with $R_{23}$ or $R_{24}$ to form a ring, specifically a $C_5$-$C_{12}$ saturated alicyclic structure such as cyclopentane ring, cyclohexane ring, norbornane ring, tricyclo[5.2.1.0$^{2,6}$]decane ring, adamantane ring or tetracyclo[4.4.0.1$^{2,5}$.1$^{7,10}$]dodecane ring.

It is especially preferred that $R_{25}$ comprise a ring or $R_{25}$ bind with $R_{23}$ or $R_{24}$ to comprise a ring, specifically a cyclopentane ring, cyclohexane ring, norbornane ring, tricyclo[5.2.1.0$^{2,6}$]decane ring, adamantane ring, tetracyclo[4.4.0.1$^{2,5}$.1$^{7,10}$]dodecane ring or the like to attain a fine pattern since the difference between the solubilities in an alkaline developer before and after lithography is large in such cases.

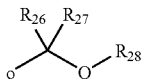

(b2)

In Formula (b2), o represents binding site of Formula (b2). $R_{26}$ and $R_{27}$ independently represent a hydrogen atom or $C_1$-$C_4$ hydrocarbon group. Specific examples of $R_{26}$ and $R_{27}$ include a hydrogen atom and $C_1$-$C_4$ alkyl group such as methyl group, ethyl group, n-propyl group, i-propyl group, n-butyl group or i-butyl group. $R_{28}$ represents a $C_1$-$C_{12}$ hydrocarbon group and specific examples thereof include a linear, branched or cyclic $C_1$-$C_{12}$ alkyl group such as methyl group, ethyl group, n-propyl group, i-propyl group, n-butyl group, i-butyl group, t-butyl group, 2-ethyl hexyl group, cyclopentyl group, cyclohexyl group, norbornyl group, tricyclo[5.2.1.0$^{2,6}$]decanyl group, adamantyl group or tetracyclo[4.4.0.1$^{2,5}$.1$^{7,10}$]dodecanyl group. $R_{26}$ may make a bond with $R_{27}$ or $R_{28}$ to form a ring. Specific examples of the ring formed by $R_{26}$-$R_{27}$ bonding include cyclopentane ring, cyclohexane ring, norbornane ring, tricyclo[5.2.1.0$^{2,6}$]decane ring, adamantane ring and tetracyclo[4.4.0.1$^{2,5}$.1$^{7,10}$]dodecane ring, and specific examples of the ring formed by $R_{26}$-$R_{28}$ bonding include tetrahydrofuran ring and hydropyran ring.

Specific examples of the repeating unit (B) will now be described in the following; however, the present invention is not restricted thereto. Among the following repeating unit (B)s, one or a plurality of the following structures may be selected and used.

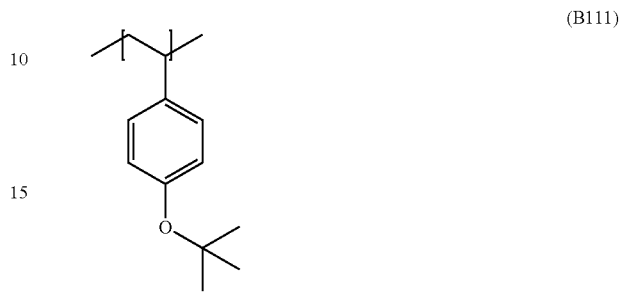

(B111)

(B112)

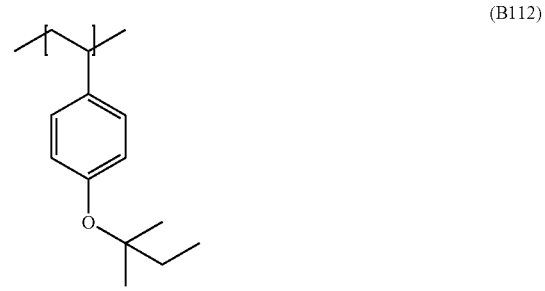

(B121)

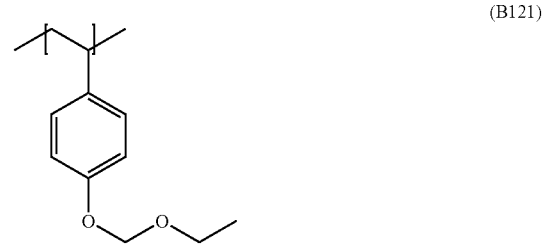

(B122)

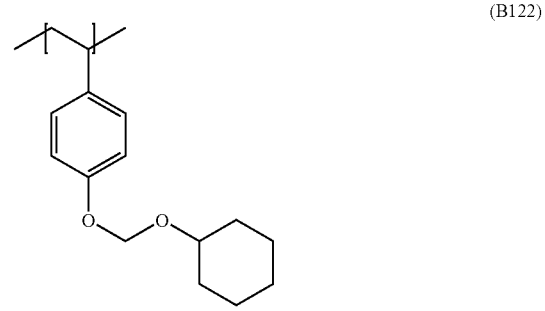

(B123)

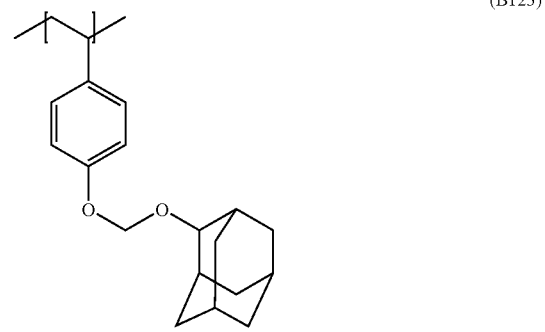

(B124) 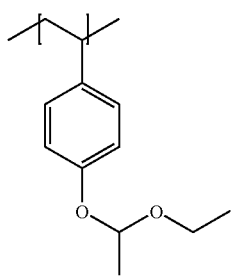
(B125) 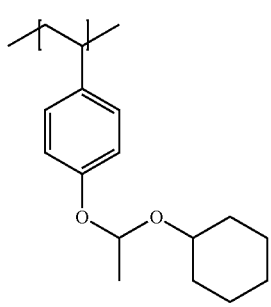
(B221) 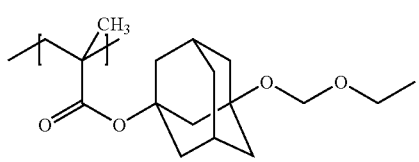
(B222) 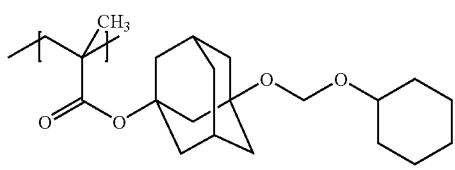
(B223) 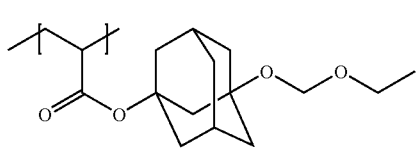
(B224) 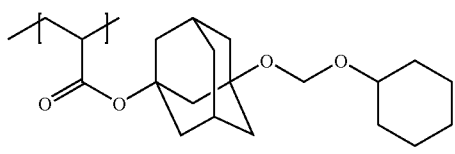
(B225) 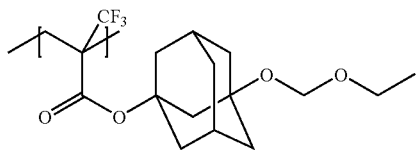
(B226) 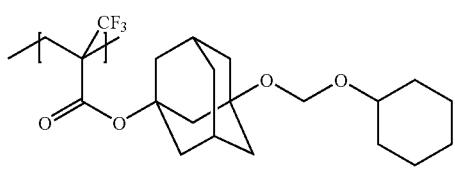
(B3101) 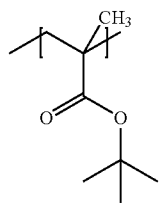
(B3102) 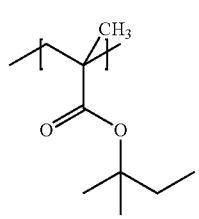
(B3103) 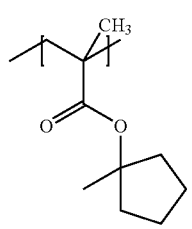
(B3104) 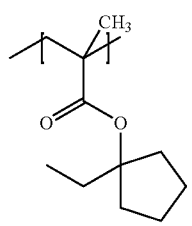
(B3105) 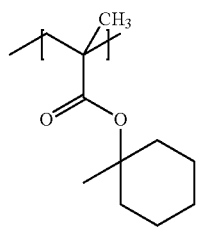
(B3106) 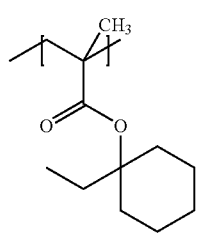
(B3107) 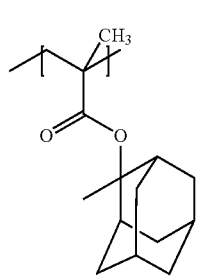

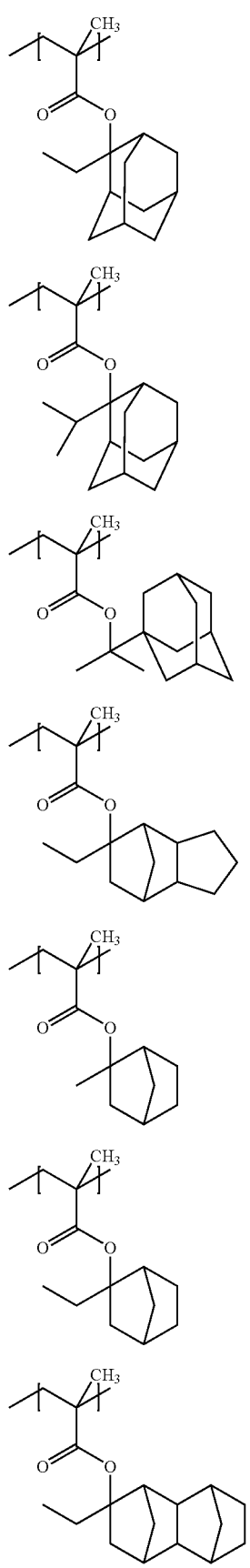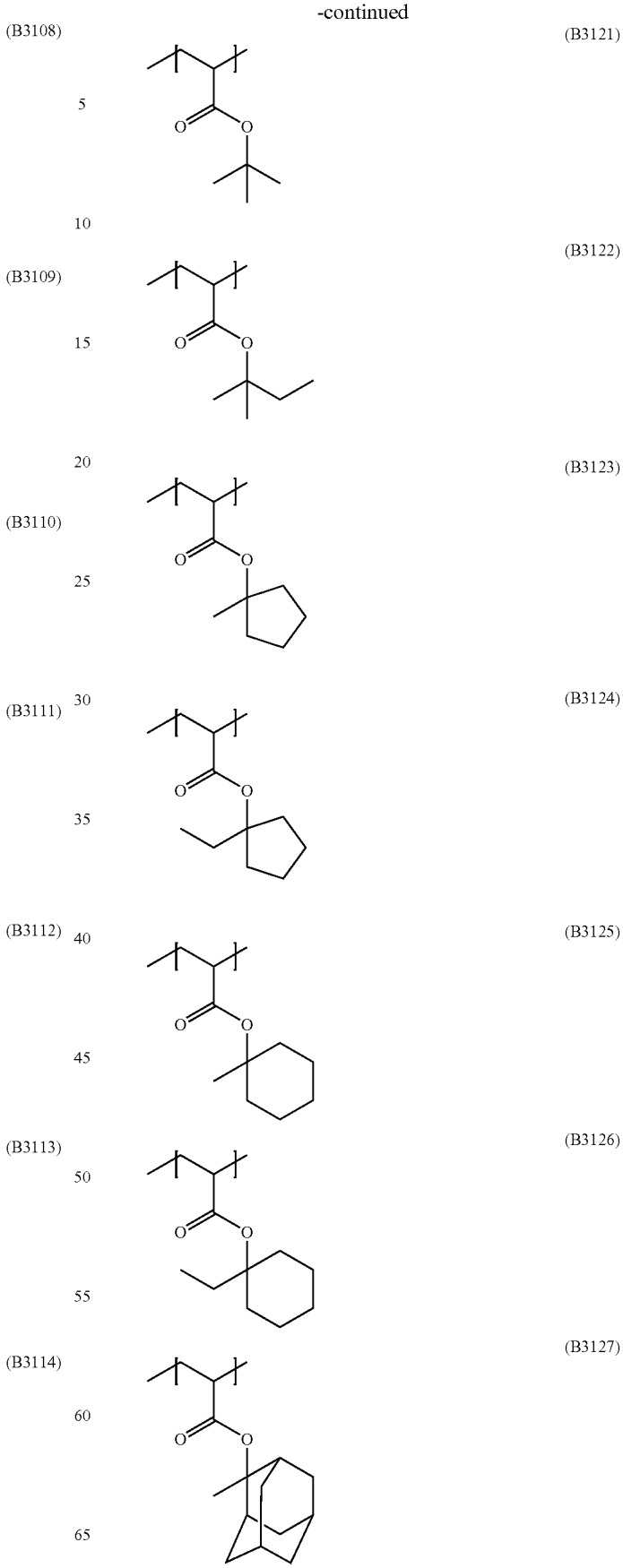

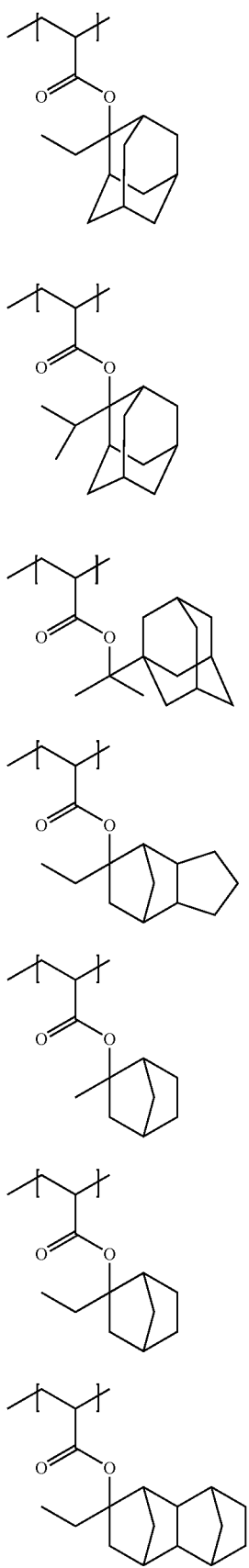
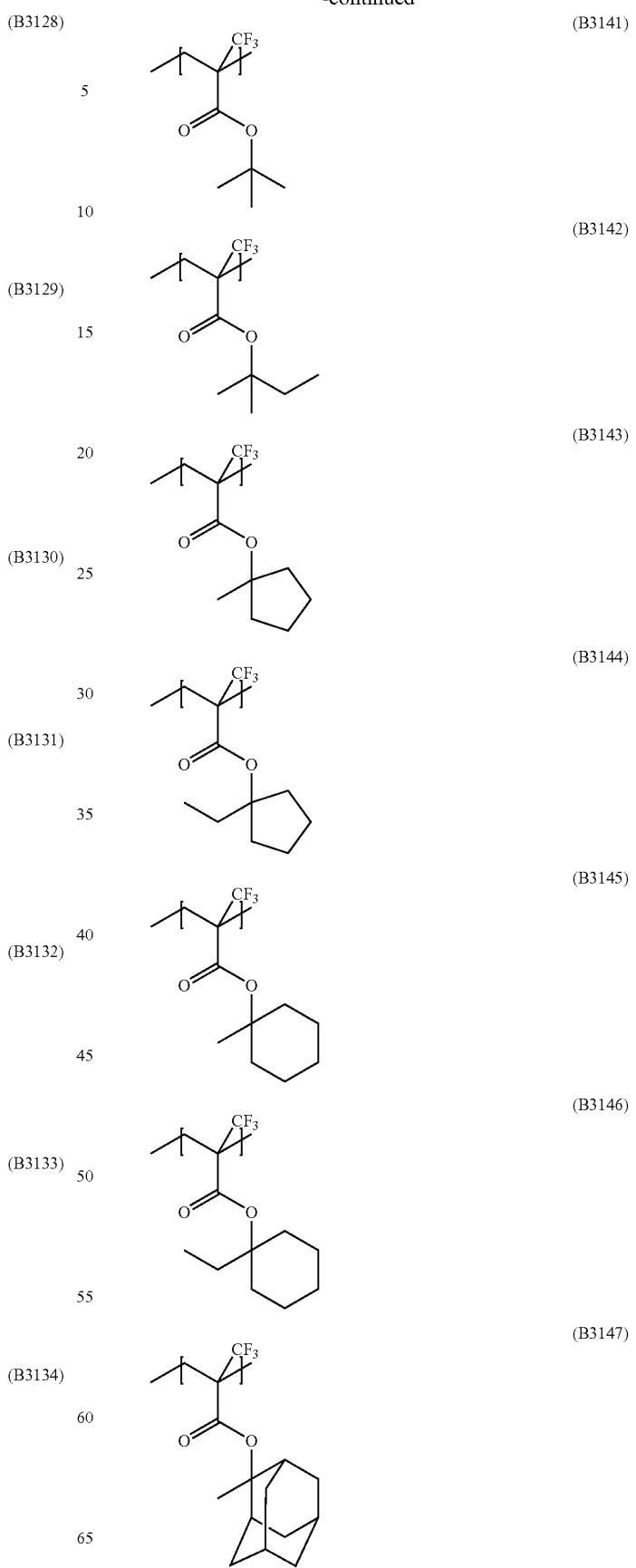

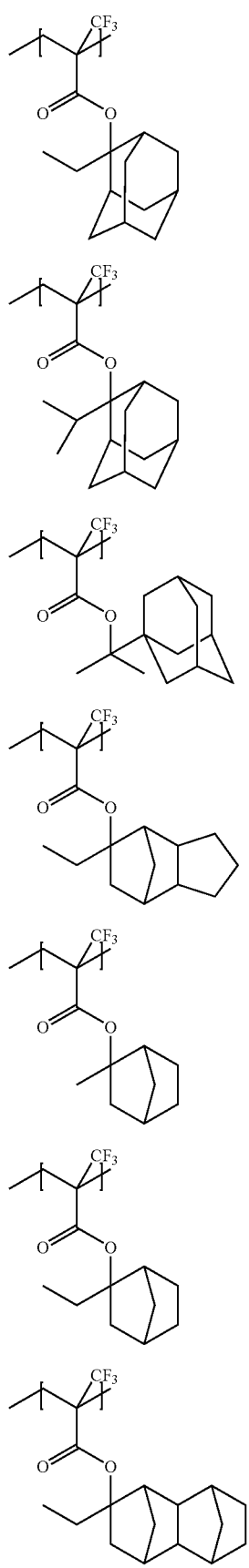
(B3148)
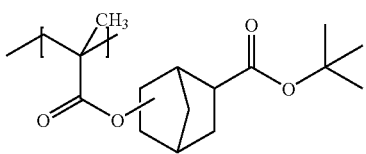
(B3149)
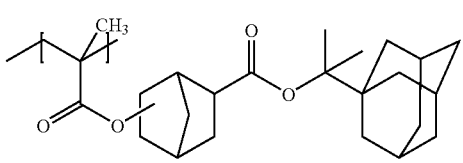
(B3150)
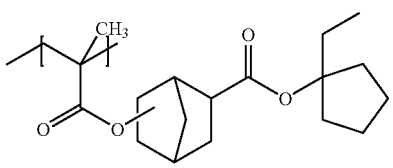
(B3151)
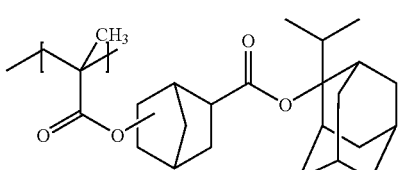
(B3152)
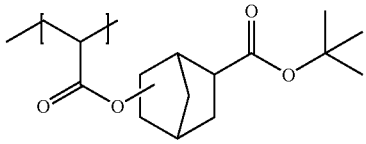
(B3153)
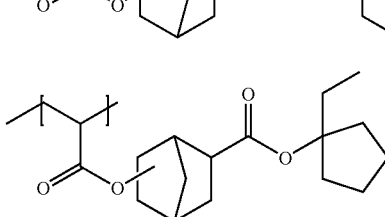
(B3154)
(B3161)
(B3162)
(B3163)
(B3164)
(B3171)
(B3172)
(B3173)
(B3174)
(B3181)
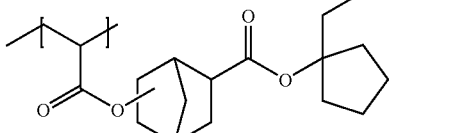
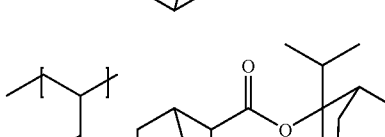
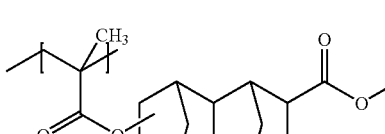
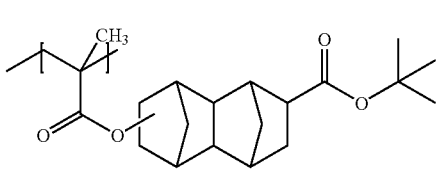

(B3182) 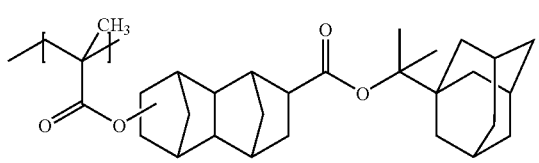
(B3183) 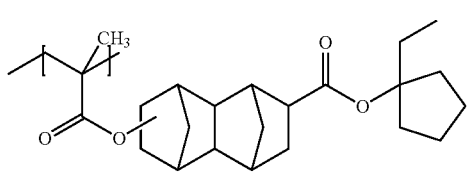
(B3184) 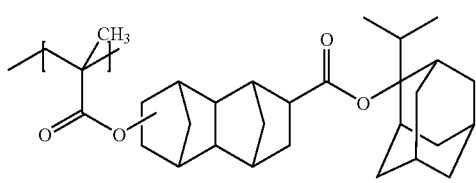
(B3191) 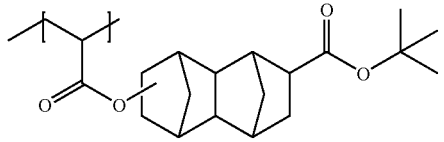
(B3192) 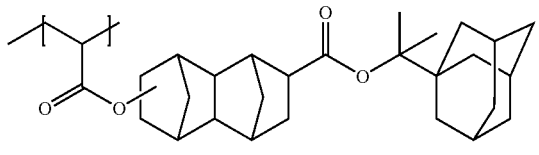
(B3193) 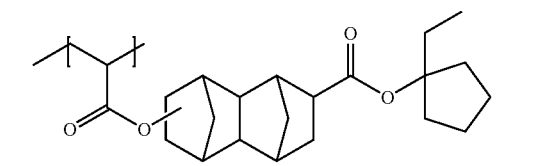
(B3194) 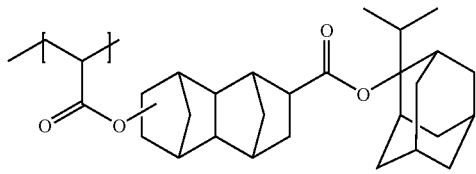
(B3201) 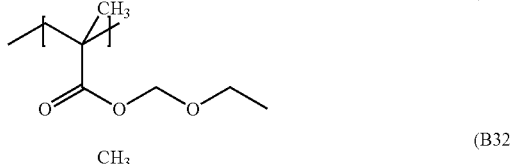
(B3202) 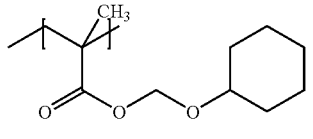
(B3203) 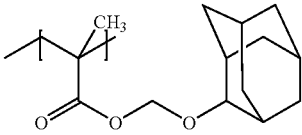
(B3204) 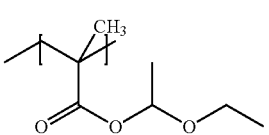
(B3205) 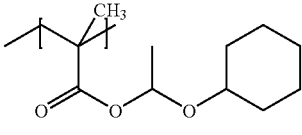
(B3206) 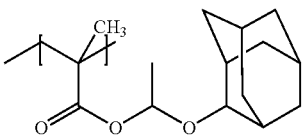
(B3207) 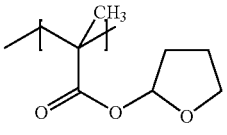
(B3208) 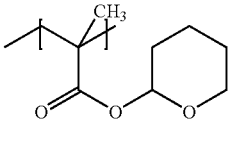
(B3209) 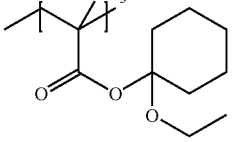
(B3211) 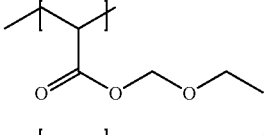
(B3212) 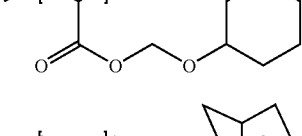
(B3213) 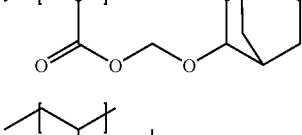
(B3214) 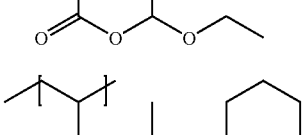
(B3215) 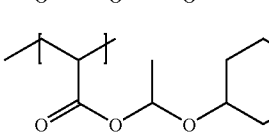

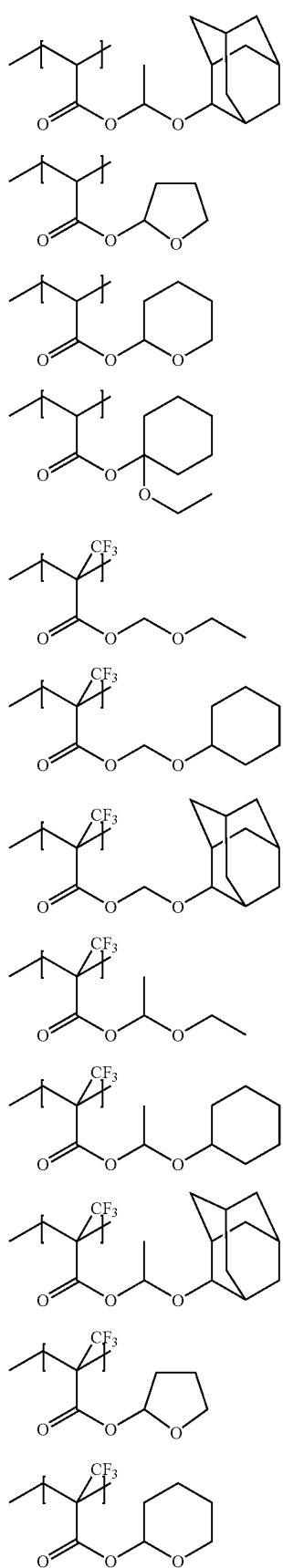
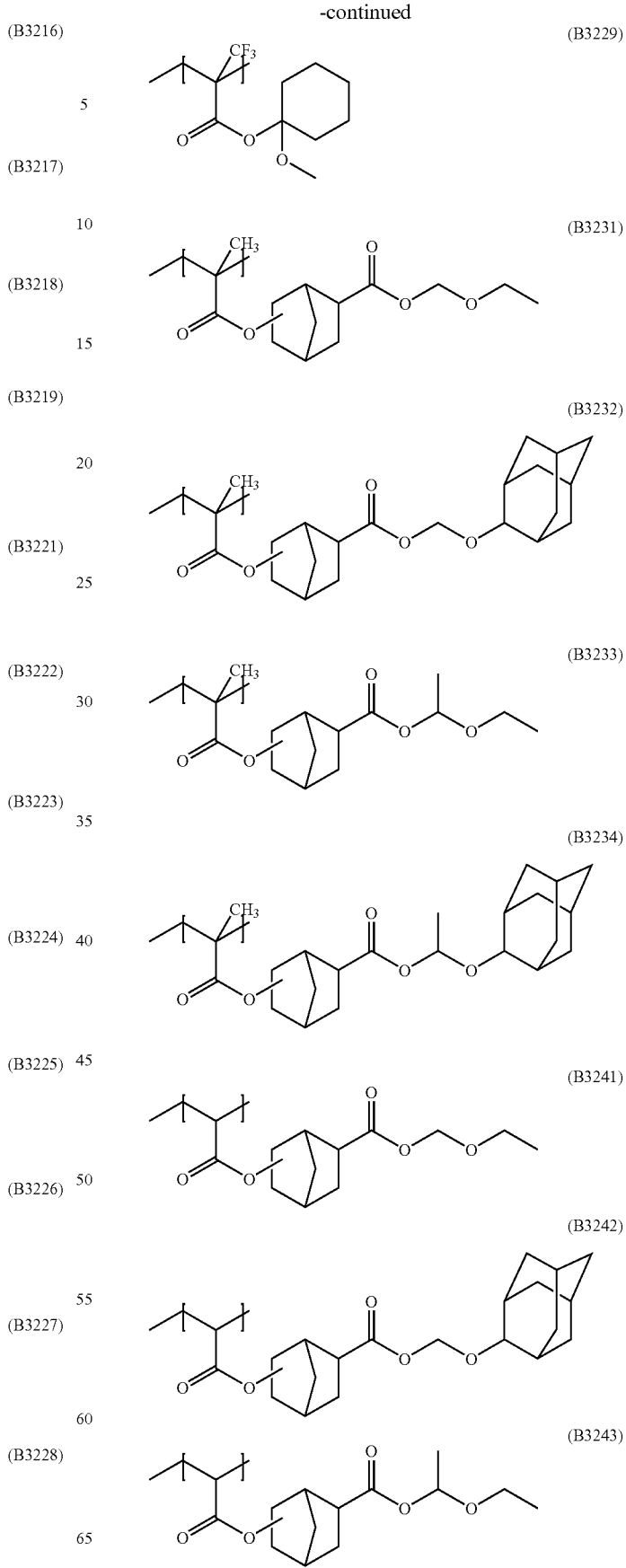

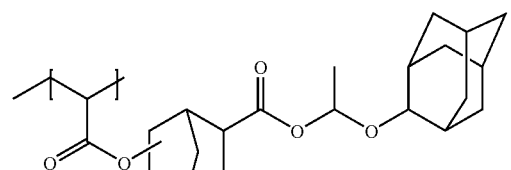
(B3244)

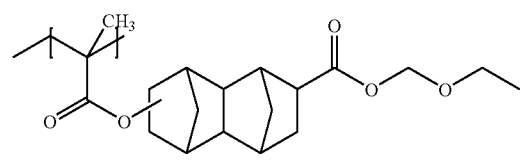
(B3252)

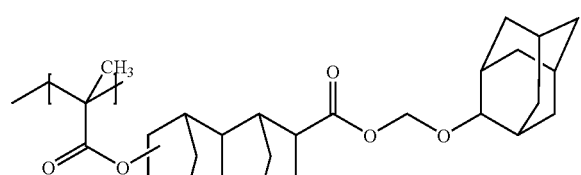
(B3253)

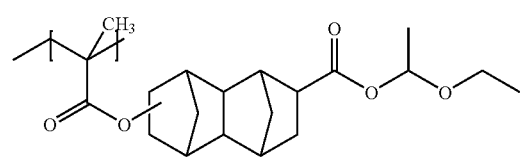
(B3254)

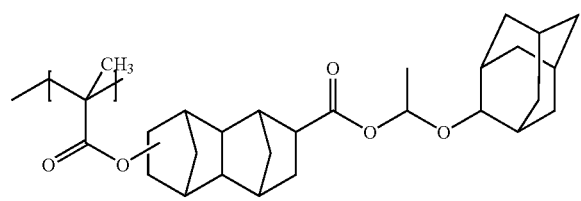
(B3261)

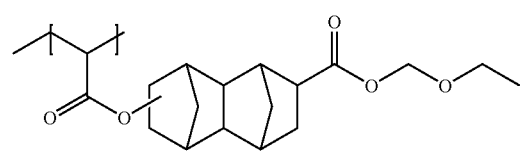
(B3262)

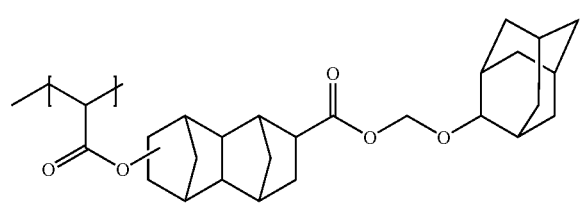
(B3263)

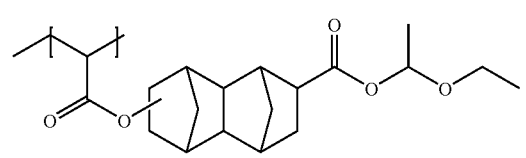

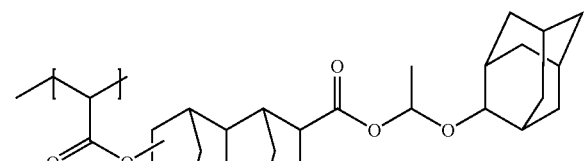
(B3264)

(B2151)

(3) Repeating Unit (C)

The repeating unit (C) is a repeating unit having a lactone structure and has a function to increase the adhesiveness to a substrate and base film and to control the solubility in a lithography solvent and alkaline developer. Preferable examples of the repeating unit (C) include the structure represented by Formula (C).

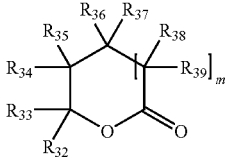
(C)

In Formula (C), $R_{30}$ represents a hydrogen atom or $C_1$-$C_4$ hydrocarbon group which may be substituted with one or more fluorine atom. Specific examples of $R_{30}$ include a hydrogen atom and $C_1$-$C_4$ alkyl group such as methyl group, ethyl group, n-propyl group, i-propyl group, n-butyl group, i-butyl group or trifluoromethyl group, and $R_{30}$ is preferably a hydrogen atom, methyl group or trifluoromethyl group. $R_{31}$ represents a group containing the lactone structure represented by Formula (c).

(c)

In Formula (c), any one of $R_{32}$-$R_{39}$ represents a single bond being a binding site of $R_{31}$ and the rest of $R_{32}$-$R_{39}$ represent a hydrogen atom, $C_1$-$C_4$ hydrocarbon group or $C_1$-$C_4$ alkoxy group; or any one of the $R_{32}$-$R_{39}$ represents a $C_3$-$C_{14}$ hydrocarbon group which may contain an oxygen atom or a sulfur atom and which has a binding site as $R_{31}$ and binds to any one or two of the other $R_{32}$-$R_{39}$ to form an alicyclic structure, any one of two of the remaining $R_{32}$-$R_{39}$ represent a single bond to form the above-described $C_5$-$C_{15}$ alicyclic structure and the rest of $R_{32}$-$R_{39}$ represent a hydrogen atom, $C_1$-$C_4$ hydrocarbon group or $C_1$-$C_4$ alkoxy group. Specific examples of the alicyclic structure include a cyclopentane ring, cyclohexane ring, norbornane ring, 7-oxa-norbornane ring, 7-thia-norbornane ring and tetracyclo[4.4.0.1$^{2,5}$.1$^{7,10}$]dodecane ring, and preferable examples include norbornane ring and 7-oxa-norbornane ring. Specific examples of the $C_{1-4}$ hydrocarbon group include a methyl group, ethyl group, n-propyl group, i-propyl group, n-butyl group, i-butyl group, and specific examples of the $C_{1-4}$ alkoxy group include a methoxy group and ethoxy group. Further, m represents an integer of 0 or 1.

Especially preferable examples of the lactone structure in which any one of $R_{32}$-$R_{39}$ represents a single bond being a binding site of $R_{31}$ and the rest of $R_{32}$-$R_{39}$ represents a hydrogen atom, $C_1$-$C_4$ hydrocarbon group or $C_1$-$C_4$ alkoxy group include a γ-butyrolactone structure and δ-valerolactone structure. Especially preferable examples of the lactone structure in which any of the $R_{32}$-$R_{39}$ represents a $C_3$-$C_{14}$ hydrocarbon group which may contain an oxygen atom or sulfur atom and which has a binding site as $R_{31}$ and binds to any one or two of the other $R_{32}$-$R_{39}$ to form an alicyclic structure, any one of two of the remaining $R_{32}$-$R_{39}$ represent a single bond to form the above-described $C_5$-$C_{15}$ alicyclic structure and the rest of $R_{32}$-$R_{39}$ represent a hydrogen atom, $C_1$-$C_4$ hydrocarbon group or $C_1$-$C_4$ alkoxy group include a 1,3-cyclohexane carbolactone structure, 2,6-norbornane carbolactone structure, 7-oxa-2,6-norbornane carbolactone structure and 4-oxa-tricyclo[5.2.1.0$^{2,6}$]decan-3-one structure.

Specific examples of the repeating unit (C) will now be described in the following; however, the present invention is not restricted thereto. Among the following repeating unit (C)s, one or a plurality of the following structures may be selected and used.

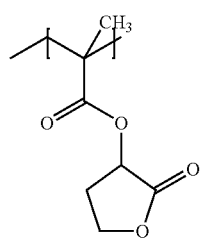
(C101)

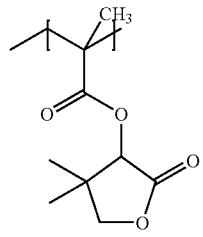
(C102)

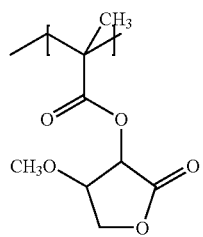
(C103)

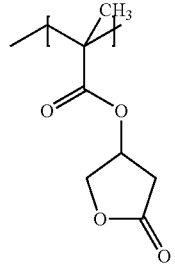
(C104)

-continued

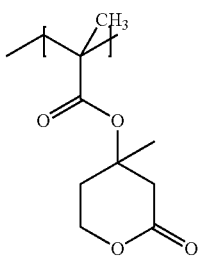
(C105)

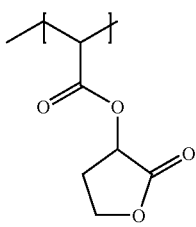
(C106)

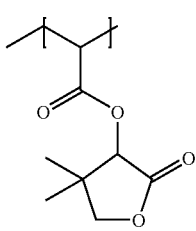
(C107)

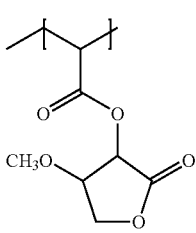
(C108)

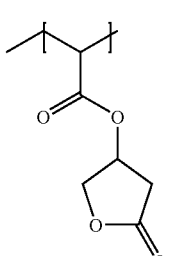
(C109)

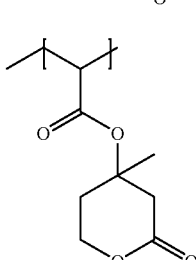
(C110)

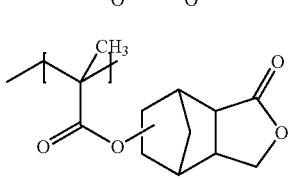
(C111)

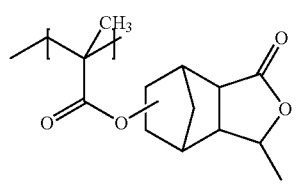
(C112)
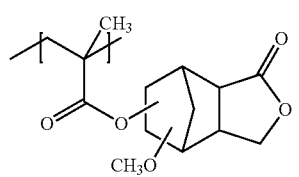
(C113)
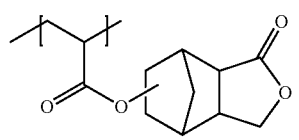
(C115)
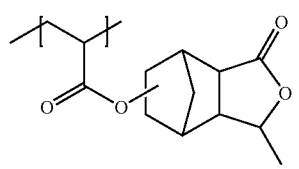
(C116)
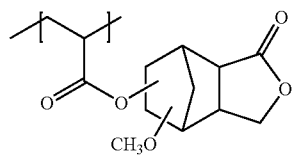
(C117)
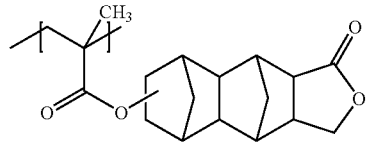
(C121)
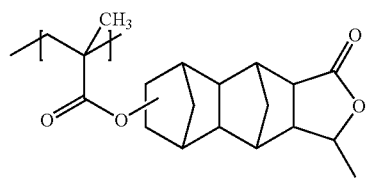
(C122)
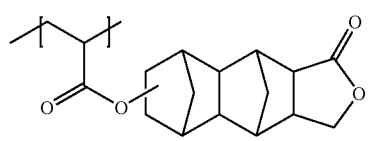
(C125)
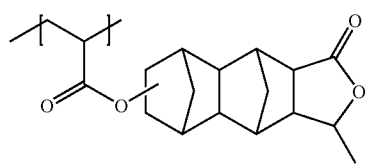
(C126)

(C151) 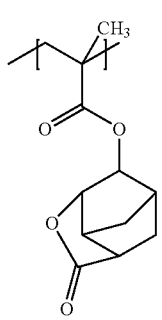
(C152) 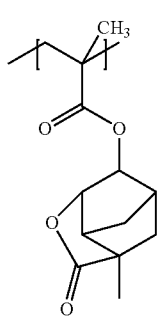
(C153) 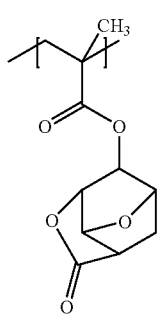
(C154) 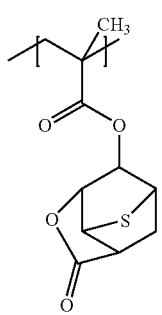
(C155) 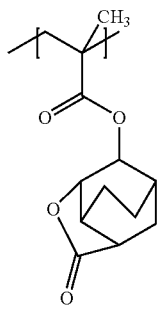
(C156) 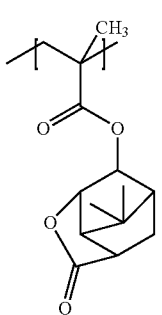
(C157) 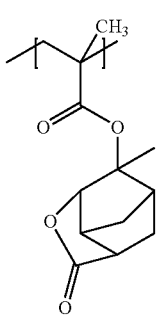
(C158) 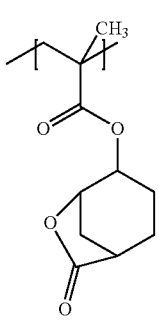
(C159) 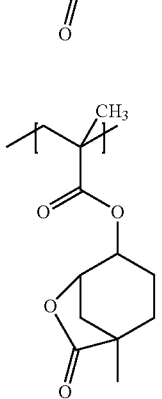
(C160) 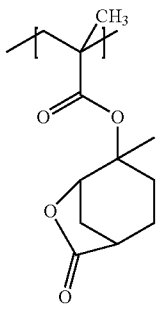

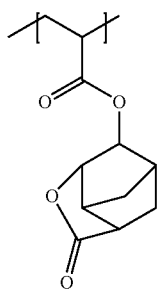
(C171)
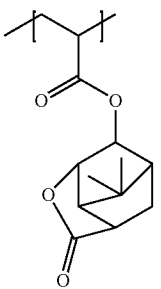
(C176)
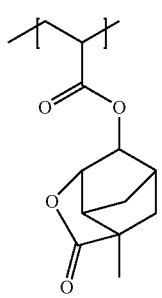
(C172)
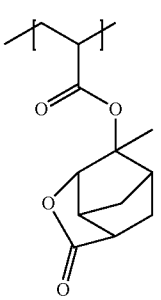
(C177)
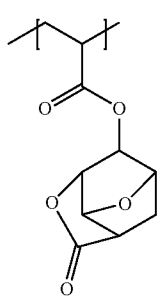
(C173)
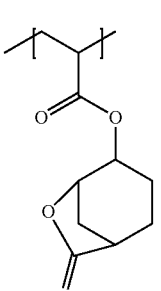
(C178)
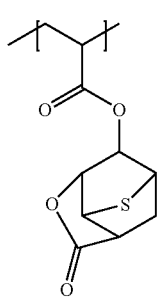
(C174)
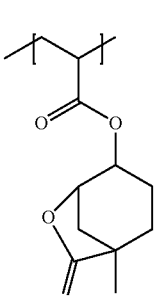
(C179)
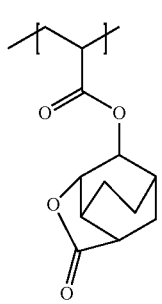
(C175)
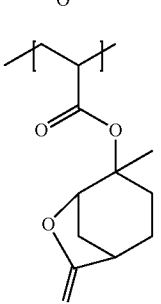
(C180)
(4) Repeating Unit (D)
The repeating unit (D) is a repeating unit having a cyclic ether structure and has a function to increase the adhesiveness to a substrate and base film, to control the solubility in a lithography solvent and alkaline developer, and to react with a curing agent to form a cross-linked structure. Preferable examples of the repeating unit (D) include the structure represented by Formula (D).

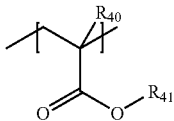
(D)

In Formula (D), $R_{40}$ represents a hydrogen atom or $C_1$-$C_4$ hydrocarbon group which may be substituted with one or more fluorine atom. Specific examples of $R_{40}$ include a hydrogen atom and $C_1$-$C_4$ alkyl group such as a methyl group, ethyl group, n-propyl group, i-propyl group, n-butyl group, i-butyl group or trifluoromethyl group, and $R_{40}$ is preferably a hydrogen atom, methyl group or trifluoromethyl group. $R_{41}$ represents a $C_3$-$C_7$ hydrocarbon group containing a 3- to 6-membered cyclic ether structure. Specific examples of $R_{41}$ include a hydrocarbon group having an epoxy ring, oxetane ring, tetrahydrofuran ring or tetrahydropyran ring, and more specific examples include glycidyl group, oxetanylmethyl group, tetrahydrofuranylmethyl group and tetrahydropyranylmethyl group, and a glycidyl group is especially preferred.

Specific examples of the repeating unit (D) will now be described in the following; however, the present invention is not restricted thereto. Among the following repeating unit (D)s, one or a plurality of the following structures may be selected and used.

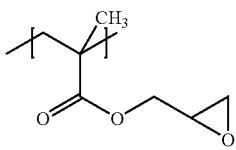
(D101)

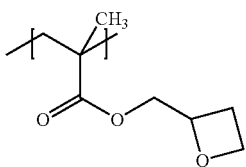
(D102)

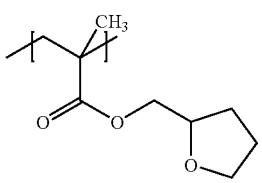
(D103)

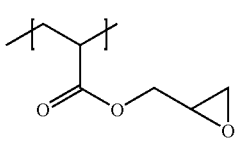
(D111)

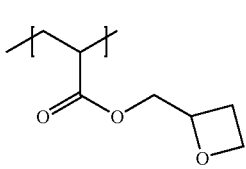
(D112)

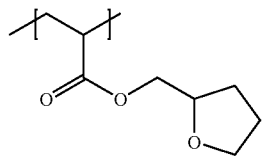
(D113)

(5) Repeating Unit (E)

A repeating unit (E) is a repeating unit having an acid-stable dissolution inhibiting structure and has a function to control the solubility in a lithography solvent or alkaline developer and the optical properties and the like such as the refractive index and light transmittance of thin film. Preferable examples of the repeating unit (E) include the structure (E1), structure (E2) and structure (E3) in which the hydrogen atom of the hydroxyl group of the structures represented by Formula (A1), Formula (A2) and Formula (A3) is substituted by an acid-stable dissolution inhibiting group, respectively.

Examples of the acid-stable dissolution inhibiting group represented by the structures (E1) to (E3) include a $C_1$-$C_{12}$ hydrocarbon group whose carbon atom that substitutes the hydrogen atom of hydroxyl group to bind with the oxygen atom thereof is a primary to tertiary carbon atom or a structure to which 1-adamantyl group is bound. Specific examples of the acid-stable dissolution inhibiting group include a linear, branched or cyclic $C_1$-$C_{12}$ alkyl group such as methyl group, ethyl group, n-propyl group, i-propyl group, n-butyl group, i-butyl group, cyclopentyl group, cyclohexyl group, 2-norbornyl group, 2-isobornyl group, 8-tricyclo[5.2.1.0$^{2,6}$]decanyl group, 1-adamantyl group, 2-adamantyl group or 4-tetracyclo[4.4.0.1$^{2,5}$.1$^{7,10}$]dodecanyl group.

Further, another preferable example of the acid-stable dissolution inhibiting group includes Structure (E4) represented by Formula (E4).

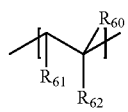
(E4)

In Formula (E4), $R_{60}$ represents a hydrogen atom or a $C_1$-$C_4$ hydrocarbon group which may be substituted with one or more fluorine atom. Specific examples of $R_{60}$ include a hydrogen atom and a $C_1$-$C_4$ alkyl group which may be substituted with one or more fluorine atom, such as methyl group, ethyl group, n-propyl group, i-propyl group, n-butyl group, i-butyl group or trifluoromethyl group, and $R_{60}$ is preferably a hydrogen atom, methyl group or trifluoromethyl group. $R_{61}$ is a hydrogen atom, single bond linking to $R_{62}$ or $C_1$-$C_4$ hydrocarbon group linking to $R_{62}$, and specific examples of $R_{61}$ include a hydrogen atom, single bond, methylene group, ethylene group and isopropylene group or the like. $R_{62}$ is a $C_6$-$C_{14}$ aromatic hydrocarbon group and specific examples thereof include a benzene ring, naphthalene ring and anthracene ring or the like.

Specific examples of the repeating unit (E) will now be described in the following; however, the present invention is not restricted thereto. Among the following repeating unit (E)s, one or a plurality of the following structures may be selected and used.

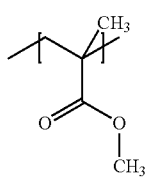 (E101)
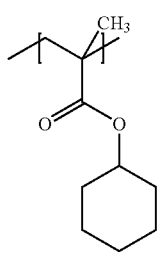 (E102)
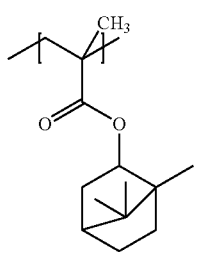 (E103)
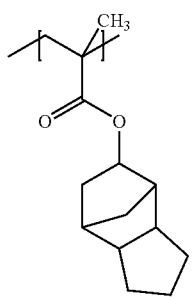 (E104)
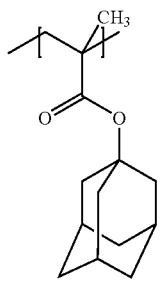 (E105)
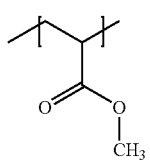 (E111)
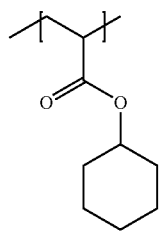 (E112)
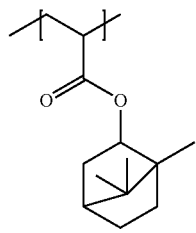 (E113)
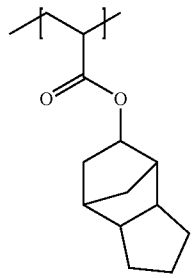 (E114)
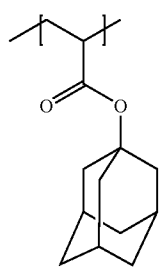 (E115)
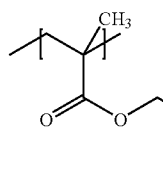 (E121)
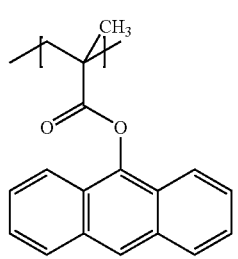 (E122)

(E123) 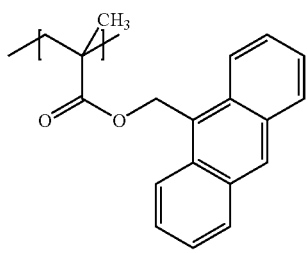

(E131) 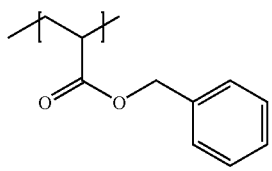

(E132) 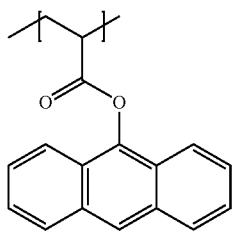

(E133) 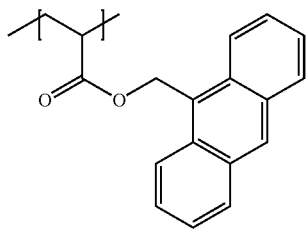

(E201) 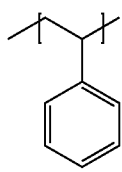

(E202) 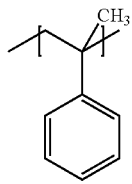

(E203) 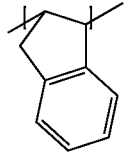

(E204) 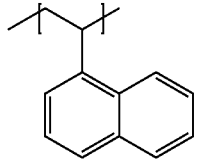

(E205) 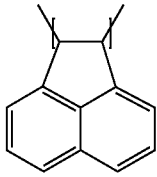

(6) Composition of the Repeating Units

The composition of each repeating unit varies depending on the purpose of the thin film used in semiconductor lithography. The range of the composition of the repeating units for respective purpose of the thin film will now be exemplified in the following.

In cases where the thin film is used for a chemically amplified positive resist film, the composition of the repeating units is selected from those wherein the repeating units (A) and (C) in combination are 20-95 mol %, preferably 30-90 mol % and more preferably 40-85 mol %; the repeating unit (B) is 5-80 mol %, preferably 10-70 mol % and more preferably 15-60 mol %; the repeating unit (E) is 0-50 mol %, preferably 0-40 mol % and more preferably 0-30 mol %.

In cases where the thin film is used for a negative resist film, the composition of the repeating units is selected from those wherein the repeating units (A) and (D) in combination are 50-100 mol %, preferably 60-100 mol % and more preferably 70-100 mol %; the repeating unit (C) is 0-50 mol %, preferably 0-40 mol % and more preferably 0-30 mol %; the repeating unit (E) is 0-50 mol %, preferably 0-40 mol % and more preferably 0-30 mol %.

In cases where the thin film is used for an anti-reflection film or topcoat film for immersion, the composition of the repeating units is selected from those wherein the repeating units (A) and (D) in combination are 5-80 mol %, preferably 10-70 mol % and more preferably 15-60 mol %; the repeating unit (B) is 0-50 mol %, preferably 0-40 mol % and more preferably 0-30 mol %; the repeating unit (C) is 0-50 mol %, preferably 0-40 mol % and more preferably 0-30 mol %; the repeating unit (E) is 0-95 mol %, preferably 10-90 mol % and more preferably 20-85 mol %.

(7) Terminal Structure

The copolymer according to the present invention comprises a known terminal structure. Usually, as a polymerization initiation terminal, the copolymer comprises a radical structure generated from radical polymerization initiator. In cases where a chain transfer agent is used, the copolymer comprises, as the polymerization initiation terminal, a radical structure generated from the chain transfer agent. In cases where the copolymer is chain-transferred to solvent or monomer, it comprises a radical structure generated from the solvent or monomer as the polymerization initiation terminal. When the termination reaction is recombination termination, both terminals can comprise polymerization initiation terminal and when the termination reaction is disproportionation termination, one of the terminals can comprise polymerization initiation terminal while the other terminal can comprise a terminal structure originated from the monomer. In cases where a polymerization terminator is used, one of the terminals can comprise polymerization initiation terminal while the other terminal can comprise a terminal structure originated from the polymerization terminator. A plurality of these initiation and termination reactions may take place within a single polymerization reaction, and in such a case, a mixture of copolymers having a plurality of terminal structures is obtained. The polymerization initiator, chain transfer agent, and solvent which can be used in the present invention will be described later.

(8) Molecular Weight and Degree of Dispersion

In the copolymer according to the present invention, the solubility thereof in a resist solvent and alkaline developer is decreased when the weight average molecular weight (hereinafter, may be referred to as "Mw") is too large while the coating performance is decreased when the Mw is too small. Therefore, the Mw of the copolymer is preferably within the range of 1,000-50,000, more preferably within the range of 1,500-30,000, still more preferably within the range of 2,000-20,000, and especially preferably within the range of 3,000-15,000. Further, since a desired pattern may not be obtained in the lithography process when the molecular weight distribution is too broad or too narrow, the degree of dispersion (hereinafter, may be referred to as "Mw/Mn") is preferably within the range of 1.0-5.0, more preferably within the range of 1.0-3.0, still more preferably within the range of 1.2-2.5, and especially preferably within the range of 1.4-2.0.

2. Solvent for Coating Film Formation

The solvent for coating film formation may be any solvent which can dissolve each component constituting a lithography composition to obtain a uniform solution and any one of the known solvents for coating film formation may be used individually or two or more of them may be used as a mixed solvent. A solvent having at least one polar group selected from the group consisting of ketone bond, ester bond, ether bond and hydroxyl group is preferable for its excellent solubility. Among such solvents, a solvent having a boiling point of 110-220° C. under atmospheric pressure is especially preferred because the evaporation rate thereof is appropriate in the baking process after spin coating and such a solvent has excellent film-forming properties. Specific examples of such solvents include: a solvent having a ketone bond such as methyl isobutyl ketone, methyl isoamyl ketone, methyl amyl ketone or cyclohexanone; a solvent having a hydroxyl group and ether bond such as propylene glycol monomethyl ether or propylene glycol monoethyl ether; a solvent having an ester bond and ether bond such as propylene glycol monomethyl ether acetate (PGMEA), propylene glycol monoethyl ether acetate or ethyl 3-ethoxypropionate; a solvent having a hydroxyl group and ester bond such as methyl lactate or ethyl lactate (EL); and a solvent having an ester bond such as γ-butyrolactone. A solvent containing PGMEA is especially preferable.

3. Copolymer Solution

The copolymer solution for lithography comprises the above-described copolymers and solvent for coating film formation. Further, the copolymer solution may comprise an additive(s) required to be used as a lithography composition.

The copolymer concentration in the solution may be appropriately selected in such a manner that a viscosity of which an appropriate film thickness can be obtained when coated onto a substrate is attained; however, the concentration may be set relatively high within the range of which the copolymers can be dissolved in such a manner that they can be mixed with a solvent which is later contained in the above-described solution, other solvent which is not contained in the above-described solution, other copolymer solution for lithography and/or the like. Usually, the copolymer concentration in the solution is adjusted to be within the range of 2-60% by weight, preferably within the range of 3-50% by weight, and especially preferably within the range of 5-35% by weight.

As an example of the cases where the copolymer solution comprises an additive(s) required to be used as a lithography composition, the copolymer solution may contain a radiation-sensitive acid generator (X) (hereinafter, referred to as Component (X)), an acid diffusion inhibitor (Y) (hereinafter, referred to as Component (Y)) such as a nitrogen-containing organic compound which is used for preventing diffusion of acid into the parts that are not exposed to radiation, and as required, other additive(s) (Z) (hereinafter, referred to as Component (Z)).

The Component (X) may be appropriately selected from those suggested as a radiation sensitive acid generator for a chemically amplified resist. Examples thereof include onium salts such as iodonium salt and sulfonium salt, oxime sulfonates, diazomethanes such as bis(alkyl-sulfonyl)diazomethane and bis(aryl-sulfonyl)diazomethane, nitrobenzyl sulfonates, imino sulfonates, and disulfones, and among these, an onium salt having fluorinated alkyl sulfonic acid ion as its anion is especially preferred. Those may be used individually, or two or more of these may be used in combination. The Component (X) is usually within the range of 0.5-30 parts by weight, preferably within the range of 1-10 parts by weight, based on 100 parts by weight of the copolymer.

The Component (Y) may be appropriately selected from those suggested as an acid diffusion inhibitor for a chemically amplified resist. Examples thereof include nitrogen-containing organic compounds, and primary-tertiary alkylamines or hydroxyalkylamines are preferred. Especially, tertiary alkylamines and tertiary hydroxyalkylamins are preferred and among these, triethanolamine and triisopropanolamine are especially preferred. These may be used individually, or two or more of these may be used in combination. The Component (Y) is used usually within the range of 0.01-5.0 parts by weight based on 100 parts by weight of the copolymer.

As the other additive(s) (Component (Z)), compounds which are commonly used, such as organic carboxylic acids and phosphoric acids for the purpose of preventing the sensitivity deterioration of acid generator and improving, for example, a resist pattern and post-exposure stability, additional resin for improving the performance of resist film, surfactant for improving the coating properties, dissolution inhibiting agent, plasticizer, stabilizer, coloring agent, halation inhibitor and dye, may be appropriately added as required. Examples of the organic carboxylic acids include malonic acid, citric acid, malic acid, succinic acid benzoic acid and salicylic acid, and these may be used individually, or two or more of these may be used in combination. The organic carboxylic acids are used within the range of 0.01-5.0 parts by weight based on 100 parts by weight of the copolymer.

5. Production Method

The production method according to the present invention is a method of producing a copolymer solution for semiconductor lithography, which copolymer solution comprises a copolymer having the above-described repeating unit(s) and a solvent for coating film formation, which method comprises a Step (S) in which the copolymer solution is heated under reduced pressure to distill off a part of the solvent for coating film formation and compounds having a boiling point lower than that of the solvent for coating film formation, and in which method the difference between the maximum and minimum values of the copolymer concentration among a plurality of containers is not more than 1.5%, preferably not more than 1.2%, more preferably not more than 1.0% and especially preferably not more than 0.8% of the maximum concentration when the containers are filled with copolymer solution from the same production lot. Further, the production method according to the present invention is a method of producing a copolymer solution for semiconductor lithography, which method comprises a Step (S) in which the copolymer solution is heated under reduced pressure to distill off the impurities having a boiling point lower than that of the solvent for coating film formation and a Step (U) in which a bath different from that of the Step (S) is used to stir the copolymer solution obtained via the Step (S).

A copolymer which gives the above-described repeating units can be synthesized through a Step (P) in which monomers that give the repeating units are copolymerized with polymerization initiator in an organic solvent, and as required, a Step (Q) in which a polar group of the copolymer is protected and/or a protecting group of the copolymer is dissociated. Further, the thus synthesized copolymer is purified by a Step (R) in which unreacted components such as monomers and polymerization initiator and undesired components such as a low molecular weight component such as oligomer are eliminated. As required, a Step (T) or the like, in which the copolymer solution is filtered to reduce the impurities, metal components and microgel such as high polymer, may be carried out in combination. Hereinafter, the production method will now be explained.

(1) Step (P)

In the Step (P), monomers are polymerized in an organic solvent in the presence of a polymerization initiator. In the present invention, as a device which is capable of industrial mass-production, a polymerization bath comprising at least a jacket for providing a heat medium, stirring blade and condenser is employed. It is preferred that the material of the bath be a metal container which is lined with glass to avoid contamination from the metal components and for its high thermal conductivity and safety. It is preferred that the stirring blade be a 3-blade retreat impeller, partial blade such as TWINSTIR Impeller from Kobelco Eco-Solutions Co., Ltd., FULLZONE Impeller from Kobelco Eco-Solutions Co., Ltd., or full-face blade such as BENDLEAF Impeller from Hakko Sangyo Co., Ltd. The FULLZONE Impeller and a full-face blade such as BENDLEAF Impeller are preferred for their high mixing efficiency.

It is preferred that the polymerization of the present invention be carried out by so-called dropping method in which monomers and polymerization initiator are added dropwise into a heated solvent. A part of the monomers may be included in the heated solvent in advance. Further, a plurality of solutions having a different composition of monomers, a different concentration of polymerization initiator and/or a different concentration of chain transfer agent may be added dropwise to, for example, change, as the drop time, the composition of dropped monomers and the composition ratio of monomers, polymerization initiator and chain transfer agent.

Among dropping methods, (P1): a mixed dropping method in which monomers, together with polymerization initiator, are dissolved in a solvent as required and added dropwise into a heated solvent for polymerization and (P2): a so-called independent dropping method in which monomers and polymerization initiator are each independently dissolved as required and added dropwise separately into the heated solvent for polymerization may be adopted. However, in (P1): mixed dropping method, within the storage tank of the solution before the dropping into the polymerization system, high polymers which cause the generation of microgel are likely to be generated because there are chances where unreacted monomers at a high concentration come into contact with radicals having a low concentration. On the other hand, in (P2): independent dropping method, high polymers are not generated because the monomers do not coexist with polymerization initiator in the storage tank of the solution to be added. Therefore, (P2): independent dropping method is especially preferred.

In (P2): independent dropping method, the monomer solution and initiator solution may be pre-mixed immediately before being added into the polymerization bath; however, since high polymers can be generated before the dropping, it is especially preferred that the solutions be each independently added dropwise from separate storage tanks. The dropping rates of the monomer solution and initiator solution may be independently selected in such a manner that a copolymer having a desired molecular weight distribution can be obtained. By changing one or both of the dropping rates of the two solutions, it is also possible to obtain a copolymer having a wide variety of molecular weight distribution ranging from narrow distribution to broad distribution with good reproducibility. For example, if the amount of the initiator solution in the earlier stage of the reaction is decreased while increasing that in the later stage of the reaction, a copolymer having a relatively high molecular weight is generated in the earlier stage of the reaction when the radical concentration is low, so that a copolymer having a broad molecular weight distribution can be obtained. Each of the dropping rates may be changed continuously or stepwise.

In the dropping method, any amount of the polymerization solvent fed into the reaction bath in the earlier stage (hereinafter, may be referred to as "initially fed solvent") can be selected as long as it is not less than the minimum amount for the stirring to be carried out; however, an excessive amount is not preferred since the amount of monomer solution which may be dropped is decreased, thereby lowering the productivity. Usually, the amount is selected in the range of, for example, in terms of the volume ratio relative to the amount of the final loading (that is, the total amount of the initially fed solvent, dropped monomer solution and initiator solution), not less than 1/30, preferably 1/20-1/2 and especially preferably 1/10-1/3. In addition, part of the monomer may preliminarily be mixed in the initially fed solvent.

From a viewpoint of the productivity, it is preferred that the concentrations of monomers and polymerization initiator in the dropped solution be high. Especially in cases where the polymerizable monomers or polymerization initiator is in liquid form, it may be dropped as it is without being dissolved in a solvent; however, when the polymerizable monomers or polymerization initiator is a viscous liquid or a solid, it is preferred to dissolve it in a solvent. When the polymerizable monomers or polymerization initiator is used in a dissolved form in a solvent, an unnecessarily high concentration increases the viscosity of the solution, thereby lowering the operativity. Further, when the polymerizable monomers or polymerization initiator is solid, in some cases, high polymers are likely to be generated since the polymerizable monomers or polymerization initiator may separate out and/or the diffusion thereof within the polymerization system may take longer. Therefore, it is preferable to select a concentration at which each monomer and polymerization initiator is sufficiently dissolved and they are easily diffused within the polymerization system without separating during the dropping in such a viscosity range that the operativity of the dropping is acceptable. The specific concentration varies depending on the combination of the solute and solvent in each solution and the like; however, it is usually prepared, in terms of each of the combined concentration of all of the monomers and the concentration of polymerization initiator, for example, in the range of 5-60% by weight and preferably 10-50% by weight.

The polymerization temperature may be appropriately selected according to the boiling point of the solvent, monomers, the chain transfer agent and the like, half-life temperature of the polymerization initiator, and the like. There is an issue with the productivity at a low temperature since the polymerization does not easily proceed, and there is an issue with the stability of the monomers and copolymers at an unnecessary high temperature. Therefore, the polymerization temperature is preferably within the range of 40-160° C., and especially preferably within the range of 60-120° C.

It is preferred that the polymerization temperature be precisely controlled in order to attain the molecular weight of copolymers and the composition of copolymers as intended. Since the polymerization is usually exothermic reaction and the polymerization temperature tends to be increased by the polymerization reaction, it is difficult to keep the temperature constant. If the polymerization temperature becomes too high, the polymerization reaction may become uncontrollable. Therefore, in the present invention, it is preferred that at least one compound having a boiling point close to the target polymerization temperature be included as a polymerization solvent, and the polymerization temperature is set at or higher than the initial boiling point of the components included in the polymerization solvent under the polymerization pressure. By this method, a rise of the polymerization temperature can be controlled by the latent heat of vaporization of the polymerization solvent. Specific Examples of such compound include water, ketones such as acetone, methyl ethyl ketone, methyl isobutyl ketone, methyl isoamyl ketone, methyl amyl ketone and cyclohexanone; alcohols such as methanol, ethanol and isopropanol; alcohol ethers such as ethylene glycol monomethyl ether, ethylene glycol monoethyl ether, propylene glycol monomethyl ether and propylene glycol monoethyl ether; esters such as methyl acetate, ethyl acetate, isopropyl acetate, propyl acetate, butyl acetate, methyl propionate, methyl lactate and ethyl lactate; ether esters such as ethylene glycol monomethyl ether acetate, ethylene glycol monoethyl ether acetate, propylene glycol monomethyl ether acetate and propylene glycol monoethyl ether acetate; ethers such as tetrahydrofuran, 1,4-dioxane and ethylene glycol dimethyl ether; aromatic hydrocarbons such as toluene and xylene; N,N-dimethylformamide and acetonitrile. From a viewpoint of the boiling point and the solubility of the monomers, polymerization initiator, chain transfer agent and copolymers, acetone, methyl ethyl ketone, methyl isobutyl ketone, isopropanol, propylene glycol monomethyl ether, methyl acetate, ethyl acetate, isopropyl acetate, propyl acetate, methyl propionate, tetrahydrofuran, 1,4-dioxane, ethylene glycol dimethyl ether, toluene and acetonitrile are preferred. These may be used individually, or two or more of these may be used in combination. Further, a compound having a high boiling point and good solubility of monomers, polymerization initiator, chain transfer agent and copolymer may be mixed to the solvent and used, and examples of the compound include ethylene glycol monobutyl ether, 3-methoxy-3-methyl-1-butanol, 3-methoxy-3-methyl-1-butyl acetate, ethyl 3-ethoxypropionate, γ-butyrolactone, diethylene glycol dimethyl ether, N-methylpyrrolidone and dimethyl sulfoxide.

The polymerization pressure may be appropriately selected; however, it is preferred that the polymerization be carried out under the vicinity of atmospheric pressure by making the polymerization system an open system because, when radicals are generated from the initiator, nitrogen gas is generated if the radicals are azo radicals while oxygen gas is generated if the radicals are peroxide radicals, and also because the atmospheric pressure hardly changes.

It is preferred that heat be supplied externally since the polymerization zone is cooled by the dropped solution, refluxing polymerization solvent, radiation of heat to the outside and the like. In the present invention, heat is supplied by providing a jacket with a heated heat medium.

In a device of a scale of mass-production, the dropping distance is longer, so that the falling velocity of the dropped solution to the surface of the heated solvent is increased. Because of this, droplets of the dropped solution splash off the surface of the solvent and adhere to the wall surface of the bath which is the heating surface. Since the solvent of the splashed droplets is vaporized on the wall surface of the bath, and the monomer concentration becomes high, the polymerization is started by the polymerization initiator present in the droplets in advance in (P1) and by the small amount of polymerization initiator mixed into the droplets during the splashing in (P2), so that high polymers are likely to be generated. In cases where a part of the monomers are contained in the heated solvent in advance and then the remaining monomers are dropped and in cases where a plurality of solutions having different composition of monomers are dropped, copolymers having a composition outside the designed composition of repeating units and copolymers having consecutive repeating units of a certain type are likely to be generated in the droplets. Such matters also easily become the cause for the generation of microgel as well as height polymer. If the introduction tube is extended to the vicinity of the solution surface to prevent the dropped solution from adhering to the wall surface of the bath, the monomers are subjected to undue heat load because of the residence time in the introduction tube, the result is rather more likelihood for the generation of high polymers.

Because of this, it is preferred that the temperature difference between the heat medium provided to the jacket and the polymerization zone be kept small as much as possible. The temperature difference between the heat medium provided to the jacket and the polymerization zone is preferably not more than 10° C. and especially preferably not more than 5° C.

Further, it is not preferred to drop the monomer solution at a low temperature into the polymerization zone since the temperature becomes locally low and the monomer concentration becomes locally high, thereby generating an environment of low radical concentration, so that high polymers are likely to be generated.

Examples of the method of prewarming the monomer solution include a method in which monomer solution is heated in the storage tank or immediately before being dropped into the polymerization zone using a heat exchanger or the like. The temperature of the prewarming is preferably not less than 25° C. and more preferably not less than 30° C. However, when the monomer solution is preheated in the storage tank, since the monomer solution would be retained in a heated condition for a longer period of time, a high prewarming temperature may result in the generation of high polymers. Therefore, in cases where the prewarming is carried out in the storage tank, the temperature is preferably not more than 50° C. and more preferably not more than 40° C. Additionally, the initiator solution may also be preheated; however, an unnecessarily high temperature degrades the polymerization initiator before the dropping, therefore, the temperature is usually not more than 40° C., preferably not more than 30° C. and more preferably not more than 25° C.

As for the dropping time of the monomer solution, a short dropping time is not preferred since it is likely to result in a broad molecular weight distribution and the temperature of the polymerization solution is decreased as a large amount of solution is dropped at a time. On the other hand, a long dropping time is not preferred as the copolymers are given an excessive thermal history and the productivity is lowered. Therefore, the dropping time is selected in the range of usually 0.5-24 hours, preferably 1-12 hours and especially preferably 2-8 hours. Further, the order to start the dropping of the two solutions is not restricted; however, to prevent high polymers from being generated, it is preferred that the two solutions be simultaneously dropped or the initiator solution be dropped first. Since it takes a certain time for the polymerization initiator to be degraded within the polymerization zone to generate radicals, the initiator solution may be dropped before the monomer solution.

After the completion of the dropping, it is preferred that the temperature be maintained for a certain period of time or be increased or the like to age the resultant, thereby reacting the remaining monomers. An excessively long aging time is not preferred as it lowers the productivity per unit time and the copolymers are given an excessive thermal history. Therefore, the aging time is selected in the range of usually not more than 12 hours, preferably not more than 6 hours and especially preferably 1-4 hours.

A known radical polymerization initiator can be used as the polymerization initiator. Preferably, it is a radical polymerization initiator such as an azo compound or peroxide. Specific examples of the azo compound include 2,2'-azobis (isobutyronitrile), 2,2'-azobis(2-methylbutyronitrile), dimethyl-2,2'-azobis(isobutyrate), 1,1'-azobis(cyclohexane-1-carbonitrile) and 4,4'-azobis(4-cyano valeric acid). Specific examples of the peroxide include decanoyl peroxide, lauroyl peroxide, benzoyl peroxide, bis(3,5,5-trimethylhexanoyl) peroxide, succinic acid peroxide, tert-butyl peroxy-2-ethyl hexanoate, tert-butyl peroxypivalate and 1,1,3,3-tetramethyl-butyl peroxy-2-ethylhexanoate. From a view point of the safety during handling, an azo compound is especially preferred. These may be used individually or in combination. The amount of the polymerization initiator may be selected according to the target Mw, the type and composition ratio of material monomers, polymerization initiator, chain transfer agent, the solvent, and the production conditions such as the polymerization temperature and dropping method.

A known chain transfer agent may be used as required. Among those known chain transfer agents, a thiol compound is preferred and can be selected from a wide variety of known thiol compounds. Specific examples thereof include t-dodecyl mercaptan, mercaptoethanol, mercaptoacetic acid and mercaptopropionic acid or the like. The amount of the chain transfer agent may be selected according to the target Mw, the type and composition ratio of material monomers, polymerization initiator, chain transfer agent, the solvent, and the production conditions such as polymerization temperature and dropping method. The chain transfer agent may be dropped in combination with the monomers or polymerization initiator, and may be dissolved in advance in the solvent to be heated.

(2) Step (Q)

In the Step (Q), simultaneously with or after the Step (P), the polar groups of copolymers are protected or the protecting groups of copolymers are dissociated. Examples of such step include Step (Q1) in which a part or all of the polar group of copolymers is/are protected by an acid-dissociable dissolution-inhibiting group, and Step (Q2) in which a part or all of the acid-dissociable dissolution-inhibiting group of copolymers is/are dissociated.

In the Step (Q1), copolymers having an alkaline soluble group are reacted in the form of a solution in the solvent with enol ether, halogenated alkyl ether or the like in the presence of a catalyst to introduce an acid-dissociable dissolution-inhibiting group. In the Step (Q2), copolymers having an acid-dissociable dissolution-inhibiting group are heated in the form of a solution in the solvent to dissociate the acid-dissociable dissolution-inhibiting group, so that an alkaline soluble group is introduced.

The catalyst used in the Step (Q1) and Step (Q2) is not particularly restricted as long as it is a known catalyst which can attain the above-described reactions; however, it is preferred that the catalyst be a strong acid having a pKa of not more than 1 in water at 25° C., such as hydrochloric acid, sulfuric acid, p-toluenesulfonic acid, trifluoroacetic acid or strongly acidic ion-exchange resin or the like. The solvent is preferably the solvent exemplified in the Step (P). However, in the Step (Q1), it is preferred that a solvent having a hydroxyl group such as water or alcohol be avoided as far as possible since such a solvent reacts with enol ether and halogenated alkyl ether.

(3) Step (R)

In the Step (R), unreacted components such as monomers and polymerization initiator and low molecular weight components such as oligomers that are contained in the copolymer solution obtained through the Step (P) are extracted with solvent and removed. Examples of the method include, for example, (R1): a method in which a poor solvent is added to precipitate the copolymer, followed by separation of the solvent phase; (R1a): a method in which, following (R1), after a poor solvent is added and the copolymer is washed, the solvent phase is separated; (R1b): a method in which, following (R1), after a good solvent is added to re-dissolve the copolymer and a poor solvent is further added to re-precipitate the copolymer, the solvent phase is separated; (R2): a method in which a poor solvent is added to form two phases of poor solvent phase and good solvent phase, followed by separation of the poor solvent phase; and (R2a): a method in which, following (R2), after a poor solvent is added and the good solvent phase is washed, the poor solvent phase is separated. The methods (R1a), (R1b) and (R2a) may be repeated or they may be carried out in combination. The wet cake of copolymer containing the solvent obtained in (R1), (R1a) and (R1b) may be removed as it is or may be re-dissolved in a good solvent for removal. The latter method in which the wet cake is re-dissolved in a good solvent for removal is preferred for its good workability and because it is less likely to receive contamination from the environment.

The poor solvent is not restricted as long as it hardly dissolves the copolymer; however, for example, water, an alcohol such as methanol or isopropanol, or saturated hydrocarbon such as hexane or heptane may be employed. Further, the good solvent is not restricted as long as it easily dissolves the copolymer; however, examples thereof include the compounds exemplified as polymerization solvent. These solvents may be used individually, or two or more of these may be used in combination as a mixed solvent. From a viewpoint of the management of production steps, it is preferred that the solvent be the same as the polymerization solvent.

(4) Step (S)

In the Step (S), impurities having a boiling point lower than that of the solvent for coating film formation used in other steps are reduced, thereby finishing a copolymer solution comprising copolymers and solvent for coating film formation. For example, this may be carried out by Step (S1) in which the copolymer solution comprising the solvent for coating film formation is concentrated while being heated under reduced pressure and as required, a solvent is added to further concentrate the copolymer solution; Step (S2) in which, after concentrating the copolymer solution as required while heating under reduced pressure, a part of the solvent added earlier and a part of the solvent just added are distilled off while providing the solvent for coating film formation and the resultant is further concentrated as required, so that the solvent is substituted by the solvent for coating film formation; and Step (S3) in which, after making the copolymer solution or the wet cake of copolymer a dry solid by heating under reduced pressure, this dry solid is re-dissolved in the solvent for coating film formation. Since, the impurities having a low boiling point are efficiently removed from the copolymers and the copolymer is less likely to be subjected to heat load, the Steps (S1) and (S2) are preferred.

The bath used in the Step (S) is a bath generally comprising a jacket to provide a heat medium, stirring blade, condenser and receptacle for distillate. It is preferred that the bath comprise a jacket in case of controlling the temperature. For the material thereof, a glass-lined metal container is preferred in order to avoid contamination from the metal components and for its high thermal conductivity and safety. For the stirring blade, a three retreat blade impeller, a partial blade such as TWINSTIR Impeller from Kobelco Eco-Solutions Co., Ltd., and a full-face blade such as FULLZONE Impeller from Kobelco Eco-Solutions Co., Ltd. or BENDLEAF Impeller from Hakko Sangyo Co., Ltd. are preferred.

The temperature of the Step (S) is not restricted as long as it does not deteriorate the copolymer; however, it is usually preferably not more than 100° C., more preferably not more than 80° C., still more preferably not more than 70° C., and especially preferably not more than 60° C. As for the amount of solvent which is later provided in the substitution of the solvent, compounds having a low boiling point cannot be sufficiently removed when the amount is too small, while the substitution takes a longer time and an excessive thermal history is given to the copolymer when the amount is too large, therefore, neither is preferred. The amount of the solvent for coating film formation which is provided in the Step (S2) is selected from the group consisting of usually the range between 1.05 times and 10 times, preferably the range between 1.1 times and 5 times, and especially preferably the range between 1.2 times and 3 times of the amount as the solvent required for the finished solution.

In the Step (S), the copolymer concentration in the copolymer solution may be fine adjusted to the target concentration by adding the solvent for coating film formation and stirring the resultant when the concentration is higher than the target concentration and by re-concentrating when the concentration is lower than the target concentration. The latter is not preferred since the copolymer solution is given an excessive thermal history. Therefore, it is preferred that the copolymer concentration be pre-adjusted to a concentration not lower the target concentration and subsequently be fine adjusted by adding the solvent for coating film formation when the concentration is higher than the target concentration.

However, an unduly high copolymer concentration is not preferred since it can result in precipitation of the copolymer and an increased amount of the solvent added later, which is not economically preferred, and since it introduces components having a low boiling point such as water contained in the solvent. The concentration is adjusted by adding the required amount of solvent for coating film formation after bringing the concentration higher than the target concentration usually by 0-20% by weight, preferably by 0-10% by weight, and especially preferably by 0-5% by weight.

(5) Step (T)

In the Step (T), a solution containing the copolymers is filtered to reduce the impurities, metal components and microgel such as high polymer, and it is preferred that the Step (T) be carried out after at least one of the Step (P), Step (O), Step (R) and Step (S). Especially, it is preferred that the Step (T) be carried out after the Step (S) for the high effectiveness of the removal of the impurities and microgel. It is not preferable to carry out the Step (T) after the Step (U) since the uniformity of the copolymer concentration in the copolymer solution is impaired.

Examples of the filter employed in the Step (T) include a filter aid such as diatomite, depth filter made of cellulose and/or the like, polyolefin such as polyethylene or polypropylene, polar group-containing resin such as polyamide, polyester or polyacrylonitrile, and membrane filter composed of a material selected from fluorine atom-containing resins such as fluorinated polyethylene. Examples of the depth filter include Zeta Plus 40QSH and Zeta Plus 020GN, both of which are manufactured by Cuno Inc. Examples of the membrane filter include a polyethylene filter such as Microguard or Optimizer D from Entegris Japan Inc. and nylon filter such as Ultipleat P-Nylon66, Ultipor N66, which are manufactured by Pall Corporation, PhotoSHIED or Electropor-IIEF, which are manufactured by CUNO Inc., and fluorinated polyethylene filter such as P Emflon from Pall Corporation. The filtration accuracy of the filter is usually not more than 1 µm, preferably not more than 0.5 µm, and especially preferably 0.05 µm. These filters may be used individually, or two or more of them may be used in combination.

(6) Step (U)

In the Step (U), a bath different from that of the Step (S) is used to uniformize the copolymer solution and it is preferred that the Step (U) be carried out between the Step (S) in which a part of the solvent having a low boiling point in the copolymer solution is distilled off to be made into the finished copolymer solution and the Step (W) in which the copolymer solution is filled into a storage container. The solvent for coating film formation may be added as required to fine adjust the copolymer concentration in the copolymer solution. Further, as required, the above-described additives may be added and the resultant is stirred to obtain a semiconductor composition for lithography.

The device used in the Step (U) is a bath comprising at least a stirring blade. It is preferred that the device comprise a jacket for supplying a heat medium, so that the temperature of the copolymer solution can be controlled and the uniformization by stirring can be attained in such a manner that there is little difference between the lots. For the material thereof, a metal container lined with fluorinated polyethylene or glass-lined metal container is preferred in order to avoid contamination from the metal components, and a glass-lined metal container is especially preferred for its relatively high thermal conductivity and because electrostatic generation is less likely to occur. It is preferred that the stirring blade be a three retreat blade impeller, partial blade such as TWINSTIR Impeller from Kobelco Eco-Solutions Co., Ltd., FULLZONE Impeller from Kobelco Eco-Solutions Co., Ltd., or full-face blade such as BENDLEAF Impeller from Hakko Sangyo Co., Ltd.

The stirring time in the Step (U) is not restricted as long as a sufficiently uniform solution is attained; however, a long stirring time is not preferred since the productivity is decreased. The stirring time is selected usually in the range of 1-360 minutes, preferably 2-240 minutes, more preferably 3-120 minutes and especially preferably 5-60 minutes.

The stirring temperature in the Step (U) is not restricted as long as a sufficiently uniform solution is attained; however, since the solution becomes highly viscous and is not uniformized when the temperature is too low, while the copolymer solution is given an excessive thermal history when the temperature is too high, neither is preferred. The stirring temperature is selected usually in the range of 0-60° C., preferably 5-50° C., more preferably 10-45° C. and especially preferably 15-40° C.

The stirring speed of the stirring blade is not restricted as long as a sufficiently uniform solution is attained; however, an unnecessary high speed is not preferred because it places too much load on the stirring blade. The stirring speed varies depending on the sizes of the bath and the stirring blade; however, it is selected usually in the range of 5-500 rpm, preferably 10-300 rpm, more preferably 20-200 rpm and especially preferably 30-150 rpm.

By carrying out this Step (U), the differences in the copolymer concentration among a plurality of containers filled with the copolymer solution can be made extremely small.

(8) Step (W)

In the Step (W), the copolymer solution comprising copolymers and solvent for coating film formation is filled into containers. The filling condition is such that the number of particles having a size of not less than 0.5 μm in the air is not more than 100,000/ft$^3$, more preferably not more than 50,000/ft$^3$, and especially preferably 10,000/ft$^3$.

The filling temperature is not restricted as long as filling process can be carried out; however, an unnecessary low temperature is not preferred since it makes the solution highly viscous thereby making the filling process difficult and the moisture in the air is condensed. Further, an unnecessary high temperature is not preferred as it places an excessive heat load on the copolymer solution and filling container, and flammable vapor is diffused making it unsafe. The filing temperature is selected usually in the range of 0-60° C., preferably 5-50° C. and especially preferably 10-40° C.

4. Method of Measuring the Copolymer Concentration

In order to effectively carry out the production method according to the present invention, it is preferable to employ a method which accurately measures the copolymer concentration. Examples of such method include a method in which the copolymer concentration is determined by measuring the refractive index of a copolymer solution. Details thereof will be described in the following.

The device to measure the refractive index is not particularly restricted as long as it can measure the refractive index of a liquid. The instrument may be appropriately selected from commercially available refractometers such as Abbe refractometer, digital refractometer, differential refractometer, hand-held refractometer and process refractometer. A digital refractometer is particularly preferred for its high accuracy and simplicity in measurement. A measurement sample is brought into contact with the part of the above-described refractometer which measures the refractive index for measurement.

Since the refractive index is influenced by the temperature, it is preferred that all of the measurements be carried out at a constant temperature. The measurement temperature is selected usually in the range of 0-40° C., preferably in the range of 10-30° C., and especially preferably in the range of 15-25° C. The accuracy of the measurement temperature is usually made to a single digit, preferably to the first decimal place, and especially preferably to the second decimal place. For example, in cases where measurements are to be carried out at 20° C. every time, it is preferred that the measurements be carried out at 20.0° C. every time and it is especially preferred that the measurements be carried out at 20.00° C. every time.

The thus measured refractive index of copolymer solution according to the above-described method is converted into the copolymer concentration based on the calibration curve therewith. The refractive index of copolymer solution is in a linear relation to the copolymer concentration, therefore, once the refractive index of copolymer solution and that of solvent for coating film formation are determined, a calibration curve of the refractive indices vs. the copolymer concentration can be prepared. However, usually, because the refractive index of copolymer solution varies depending on the copolymer structure, composition ratio of repeating units of copolymer and molecular weight of copolymer, and because the refractive index of the solvent for coating film formation also varies depending on the structure thereof and composition of the solvent, it is preferred that a calibration curve is prepared for each type of copolymers and solutions, so that the measurement accuracy is improved.

Examples of the method of measuring the copolymer concentration to construct the calibration curve include: a method in which the solvent components contained in the copolymer solution are evaporated using a hot plate, vacuum drier or the like and a dry solid is separated to determine the weight ratio of the dry solid to the copolymer solution; and a method in which copolymer solution of which the copolymer solution or the dry solid is re-dissolved in a solvent not contained in the original copolymer solution is analyzed by gas chromatography using a means such as the internal standard method or standard addition method, followed by quantification of the solvent components contained in the copolymer solution or the dry solid, to determine the weight ratio of components other than the solvent components. Since the solvent remains in the dry solid in the former method and the measurement errors of gas chromatography are large in the latter method, a method in which the weight ratio of dry solid is determined first by the former method and then this dry solid is re-dissolved in a solvent not contained in the original copolymer solution to quantify the solvent components which remained in the dry solid, followed by determination of the weight ratio of components other than the solvent components is preferred. It is preferred that the measurement be carried out a plurality of times to determine the average of the measurements.

It is preferred that the sample for measuring the refractive index to construct the calibration curve be one which was collected from the same solution which was used to determine the copolymer concentration. As required, the refractive index of only the solvent contained in the copolymer solution is measured as a sample having a copolymer concentration of zero. An accurate calibration curve can be prepared with the copolymer concentration at two levels; however, the concentration may be obtained at three or more levels. It is preferred that the measurement be carried out a plurality of times at each concentration level to determine the average of the measurements.

EXAMPLES

Next, the present invention will be further described by way of examples thereof; but not restricted thereto. The abbreviations used in the below examples have the followings meanings.

Monomers

Monomer O: 3-hydroxy-1-adamantyl methacrylate

Monomer M: 2-methyl-2-adamantyl methacrylate

Monomer N: 5-methacryloyloxy-2,6-norbornane carbolactone

Monomer G: glycidyl methacrylate

Monomer A: 9-anthrylmethyl methacrylate

Monomer m: methyl methacrylate

Monomer O
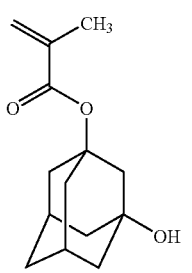

Monomer M
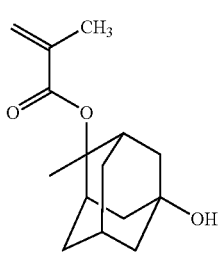

Monomer N
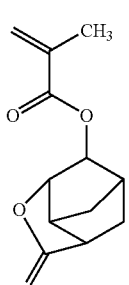

Monomer G
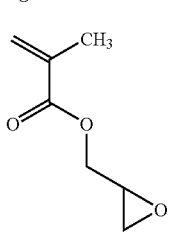

Monomer A
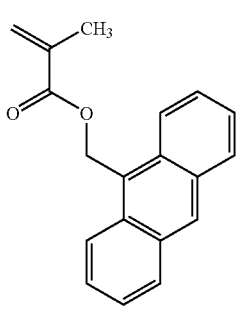

Monomer m
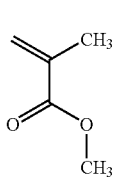

Repeating Units

O: Repeating unit (the above-described A203) derived from Monomer O

M: Repeating unit (the above-described B3107) derived from Monomer M

N: Repeating unit (the above-described C105) derived from Monomer N

G: Repeating unit (the above-described D101) derived from Monomer G

A: Repeating unit (the above-described E123) derived from Monomer A m: Repeating unit (the above-described E101) derived from Monomer m Polymerization Initiator MAIB: dimethyl-2,2'-azobis(isobutyrate)

Solvents

MEK: methyl ethyl ketone

MAK: methyl amyl ketone

THF: tetrahydrofuran

PGMEA: propylene glycol monomethyl ether acetate

PGME: propylene glycol monomethyl ether

Measurement Example 1

Measurement of Mw and Mw/Mn of Copolymers (GPC)

In a vial, 0.5 g of copolymer solution was weighed and 5.0 g of THF was added thereto followed by shaking to obtain a uniform solution. The thus obtained solution was injected into the gel permeation chromatography (GPC) apparatus to obtain the elution peaks. The Mw and Mw/Mn was calculated based on the calibration curve prepared using a standard polystyrene. The other measurement conditions were as follows.

Apparatus: GPC8220 from Tosoh Corporation

Detector: differential refractive index (RI) detector

Column: KF-804L (×3) from Showa Denko K.K.

Eluent: THF

Injected Amount: 60 μL

Measurement Example 2

Measurement of Composition of the Repeating Units of Copolymers ($^{13}$C-NMR)

Added to 1 g of copolymer dry powder was 0.1 g of Cr(acac)$_2$, 0.5 g of MEK and 1.5 g of deuterated acetone and this mixture was shaken to obtain a uniform solution. The thus obtained solution was placed in a glass tube having an inner diameter of 10 mm, which was then placed in the $^{13}$C-NMR apparatus to carry out NMR analysis. The area ratio of the thus obtained peaks was calculated and the composition ratio of each repeating unit was determined. The other conditions of the analysis are as follows.

Apparatus: AV400 from Bruker Japan Co., Ltd.

Temperature: 40° C.

The number of scans: 10,000 times

Measurement Example 3

Measurement of the Copolymer Concentration (Heating Residue GC Method)

Copolymer solution at an amount of 0.5 g (w1) was weighed on a preweighed aluminum dish, which was then placed in the vacuum drier and heated for 70 minutes at 100° C. under a pressure not more than 0.01 MPa. The residue with an aluminum dish whole was weighed and therefrom the tare of the aluminum dish was subtracted to determine the amount of the heating residue (w2). A total of 8 g of THF was added to the aluminum dish in four times at 2 g each and after dissolving the heating residue, 0.1 g of ethylbenzene was added as the internal standard and the resultant was shaken to prepare a uniform solution. This solution was injected into the gas chromatograph (GC) for analysis under the following conditions.

GC apparatus: GC-1700 from Shimadzu Corporation
Detector: Flame Ionization Detector (FID)
Column: InertCap 1 from GL Sciences Inc.
Carrier Gas: $N_2$ 100 mL/min
Split ratio: 54
Injected Amount: 5 μL
Temperature conditions:
Injection: 350° C.
Detector: 250° C.
Column: 60° C.×10 min→(20° C./min)→200×20 min The amount of residual solvent (w3) in the heating residue was determined by internal standard method and the copolymer concentration (% by weight) was calculated using the below equation (1).

$$\text{Copolymer concentration(\% by weight)}=[(w2)-(w3)]/(w1)\times 100 \quad (1)$$

For each sample, the above-described measurement was repeated for five times and the average thereof was used as the copolymer concentration.

Measurement Example 4

Measurement of the Copolymer Concentration (Refractive Index Method)

The same solvent for coating film formation as contained in the copolymer solution was dropped onto the prism of Automatic Digital Refractometer Rx-5000α from ATAGO Co., Ltd. to measure the refractive index at 20.00° C. Similarly, the same copolymer sample solution as used in the Measurement Example 3 was dropped onto the prism of Automatic Digital Refractometer RX-5000α from ATAGO Co., Ltd. to measure the refractive index at 20.00° C. The measurement was repeated three times for each measurement sample and the respective average values were determined as the refractive index of each measurement sample. A calibration curve was prepared for the thus obtained refractive index and the copolymer concentration by setting the refractive index of the solvent for coating film formation at the copolymer concentration=0 (% by weight) and setting the refractive index of the copolymer solution at the copolymer concentration (% by weight) which was found in the Measurement Example 3. Subsequently, the refractive index of the copolymer solution was determined, as described in the above, by dropping the copolymer solution onto the prism of Automatic Digital Refractometer RX-5000α from ATAGO Co., Ltd. to measure the refractive index at 20.00° C. three times, and the average of the measurements was converted into copolymer concentration using the above-described calibration curve.

Measurement Example 5

Coating Test of Copolymer Solution

Added to 100 parts by weight of the copolymer solution were 70 parts by weight of ethyl lactate and 0.03 parts by weight of the surfactant (Surflon S-381) from Seimi Chemical Co., Ltd. as the additive (Z), and the resultant was stirred to prepare a uniform solution. This solution was spin coated onto a silicon wafer at a speed of 4,000 rpm, and the thus obtained wafer was baked on a hot plate for 90 seconds at 150° C. The wafer was then cooled and the film thickness was measured at points in the film plane using the film thickness measurement instrument KT-22 from Foothill Instruments to determine the average of the measurements as the film thickness.

Example 1

Into a glass-lined monomer dissolution bath having a capacity of 200 L, which comprises a jacket and stirrer, 70.0 kg of MEK, 15.5 kg of Monomer N and 20.0 kg of Monomer M were loaded and the inside of the bath was made a nitrogen atmosphere. The loaded materials were then stirred and dissolved while providing warm water at 30±2° C. to the jacket to prepare a uniform "monomer solution". Into an initiator dissolution bath having a capacity of 20 L, which comprises a stirrer, 4.0 kg of MEK and 2.0 kg of MAIB were loaded and they were stirred and dissolved while providing warm water kept at 30±2° C. to the jacket to prepare a uniform "initiator solution". Into a glass-lined polymerization bath having a capacity of 200 L and comprising a jacket, stirrer equipped with FULLZONE Impeller from Kobelco Eco-Solutions Co., Ltd. and condenser, which bath is open to the air while being provided with a small amount of nitrogen gas ahead of the condenser, 30.0 kg of MEK was loaded and the inside of the bath was made a nitrogen atmosphere.

It was then stirred while providing warm water maintained at 83.0±0.5° C. to the jacket of the polymerization bath, and the temperature of MEK in the reaction bath was increased to 79.5° C. and this condition was kept. The jackets of the monomer dissolution bath and initiator dissolution bath were continuously provided with warm water at 30±1° C. Keeping this condition, the monomer solution and initiator solution were separately added dropwise to the polymerization bath using a quantitative pump at a constant rate for four hours. During the dropping, the polymerization bath was kept stirred while warm water maintained at 83.0±0.5° C. was continuously provided to the jacket, and the temperature of the inside of the polymerization bath was maintained at 79-81° C. After the completion of the dropping, the polymerization bath was further stirred while warm water maintained at 83.0±0.5° C. was continuously provided to the jacket, the temperature inside the polymerization bath was maintained at 80° C. and the contents in the bath was aged for 2 hours. Subsequently, cooling water of about 20° C. was provided to the jacket to cool the contents in the bath.

To an electrolytic polished purification filtration bath made of SUS316 which comprises a jacket, stirrer, filtration bed installed with a polyester filter cloth and collection pipe equipped with a valve under the filtration bed, 740 kg of methanol at 15° C. was loaded and continuously stirred while providing brine at 15±1° C. to the jacket. Added dropwise to the bath was polymerization solution while continuously stirring to precipitate copolymers, and after further stirring for 30 minutes, the solution collection valve under the filtration bed was opened while stirring continuously to discharge the filtrate, so that a wet cake was obtained. The solution collection valve under the filtration bed was closed and 650 kg of methanol at 15° C. and 90 kg of MEK were loaded into the purification filtration bath. After stirred for 30 minutes while keeping the temperature at 15° C., the operation in which the solution collection valve under the filtration bed was opened while stirring continuously to discharge the filtrate so that a wet cake is obtained was carried out twice. Several grams were taken out from the thus obtained wet cake and vacuum dried for 1 hour at a temperature not more than 60° C. to obtain dry powder. The composition ratio of repeating units of copolymers was determined according to the method of Measurement Example 2.

The solution collection valve under the filtration bed was closed and 200 kg of MEK was loaded into the purification filtration bath to dissolve the remaining wet cake. The solution collection valve was opened and the thus, obtained solution was nitrogen pressurized to be introduced into a glass-lined solvent substitution bath having a capacity of 1,000 L, which bath comprises a jacket, stirrer equipped with TWIN-STIR Impeller from Kobelco Eco-Solutions Co., Ltd. and condenser. Then, the pressure was reduced while stirring and the solution was heated by providing warm water at 55±1° C. to the jacket. While adding PGMEA as the solvent for coating film formation, light components and a part of PGMEA were distilled off to obtain a copolymer solution having PGMEA as the solvent. The thus obtained solution was partially collected and measured for the copolymer concentration according to the method of Measurement Example 4. After the required amount of PGMEA was added and stirred for 15 minutes, the thus obtained solution was once again partially collected and measured for the copolymer concentration according to the method of Measurement Example 4, so that it was confirmed that the polymer concentration was 25.0±0.1%. Further, the Mw and Mw/Mn of copolymers were determined according to the method of Measurement Example 1.

The thus obtained copolymer solution was introduced by nitrogen pressurization into a glass-lined uniformization bath having a capacity of 500 L, which comprises a jacket and stirrer equipped with TWINSTIR Impeller from Kobelco Eco-Solutions Co., Ltd. The jacket of the uniformization bath was provided with warm water and the copolymer solution was stirred for 15 minutes at 80 rpm while being kept at 30° C. Then, the copolymer solution was brought into a clean booth (class 10,000) and after 1 kg thereof was cut off, the copolymer solution was filled into seven 20 L polyethylene containers (KK-116-8 from Kodama Plastics Co., Ltd.).

A portion was collected from each of the filling containers and subjected to the determination of the copolymer concentration according to the method of Measurement Example 4. This copolymer solution was also subjected to coating test according to the method of Measurement Example 5. The results are shown in Table 1.

Example 2

The present invention was carried out in the same manner as Example 1, except that the copolymer solution was passed through Microguard from Japan Mykrolis (an ultra high molecular weight polyethylene membrane filter having a filtration accuracy of 1.0 µm and filtration area of 1 m$^2$) and PhotoSHIELD from 3M Company (Nylong 66 membrane filter having a filtration accuracy of 0.04 µm and filtration area of 1 m$^2$) between the solvent substitution bath and the uniformization bath.

Example 3

The present invention was carried out in the same manner as Example 2, except that 8.0 kg of Monomer O was added as the monomer loaded into the monomer dissolution bath and that MAK was used in place of PGMEA as the solvent for coating film formation.

Example 4

Into a glass-lined monomer dissolution bath having a capacity of 200 L, which comprises a jacket and stirrer, 65.0 kg of MEK, 12.0 kg of Monomer G, 10.0 kg of Monomer A and 20.0 kg of Monomer m were loaded and inside the bath was made a nitrogen atmosphere. The loaded materials were then stirred and dissolved while providing warm water at 30±2° C. to the jacket to prepare a uniform "monomer solution". Into an initiator dissolution bath made of polyethylene having a capacity of 20 L and comprising a stirrer, 8.0 kg of MEK and 4.0 kg of MAIB were loaded, and they were stirred and dissolved while the bath itself was immersed in the warm water bath maintained at 30±2° C. to prepare are a uniform "initiator solution". Into a glass-lined polymerization bath having a capacity of 200 L and comprising a jacket, stirrer equipped with three-brade retreat impeller from Kobelco Eco-Solutions Co., Ltd. and condenser, which bath is open to the air while being provided with a small amount of nitrogen gas ahead of the condenser, 30.0 kg of MEK was loaded and the inside the bath was made a nitrogen atmosphere.

It was then stirred while providing warm water maintained at 83.0±0.5° C. to the jacket of the polymerization bath, and the temperature of MEK in the polymerization bath was raised to 79.5° C. and this condition was sustained. The jacket of the monomer dissolution bath was continuously provided with warm water at 30±1° C. to keep the temperature of the monomer solution at 30±1° C. until the completion of the dropping. The initiator dissolution bath was taken out from the warm water bath and equipped with a scale, which was then exposed to the ambient air at about 23° C. until the completion of the dropping. Keeping this condition, the monomer solution and initiator solution were separately added dropwise to the polymerization bath using a quantitative pump at a constant rate for four hours. During the dropping, the polymerization bath was kept stirred while warm water maintained at 83.0±0.5° C. was continuously provided to the jacket, and the temperature inside the polymerization bath was maintained at 79-81° C. After the completion of the dropping, the polymerization bath was further stirred while warm water maintained at 83.0±0.5° C. was continuously provided to the jacket, the temperature inside the polymerization bath was maintained at 80° C. and the contents in the bath was aged for 2 hours.

Into a Teflon-lined purification bath which comprises a stirrer, 380 kg of hexane at 23° C. was added and stirred, and this condition was sustained. Added dropwise thereinto was polymerization solution while continuously stirring to precipitate copolymers, and after further stirring for 30 minutes, the resultant was left to stand for 30 minutes. After eliminating the supernatant, several grams were taken out from the thus obtained precipitates and vacuum dried for 1 hour at a temperature not more than 60° C. to obtain dry powder. The composition ratio of repeating units of copolymers was determined according to the method of Measurement Example 2.

Added to the remaining precipitates was 130 kg of acetone to dissolve the precipitates. This solution was then loaded into a glass-lined solvent substitution bath having a capacity of 1,000 L, which bath comprises a jacket, stirrer equipped with TWINSTIR Impeller from Kobelco Eco-Solutions Co., Ltd. and condenser. Then, the pressure was reduced while stirring and the solution was heated by providing warm water at 55±1° C. to the jacket. After distilling off a part of light components such as acetone, the light components and a part of PGME were distilled off while adding PGME as the solvent for coating film formation to obtain a copolymer solution having PGME as the solvent. The thus obtained solution was partially collected and the copolymer concentration was measured according to the method of Measurement Example 4. After the required amount of PGMEA was added and stirred for 15 minutes, the thus obtained solution was once again partially collected and the copolymer concentration measured according to the method of Measurement Example 4 to confirm that the concentration was 25.0±0.1%. Further, the Mw and Mw/Mn of copolymers were determined according to the method of Measurement Example 1.

The thus obtained copolymer solution was introduced by nitrogen pressurization into a glass-lined uniformization bath having a capacity of 500 L, which comprises a jacket and stirrer equipped with TWINSTIR Impeller from Kobelco Eco-Solutions Co., Ltd. The jacket of the uniformization bath was provided with warm water and the copolymer solution was stirred for 15 minutes at 80 rpm while being kept at 30° C. Then, the copolymer solution was brought into a clean booth (class 10,000) and after 1 kg thereof was cropped out, the copolymer solution was filled into seven 20 L polyethylene containers (KK-116-8 from Kodama Plastics Co., Ltd.).

A portion was collected from each of the filling containers and the copolymer concentration was measured according to the method of Measurement Example 4. This copolymer solution was subjected to coating test according to the method of Measurement Example 5. The results are summarized in Table 1.

Comparative Example 1

The present invention was carried out in the same manner as Example 1, except that the uniformization bath was not used and that the copolymer solution was filled into 20 L polyethylene containers directly from the solvent substitution bath.

Comparative Example 2

The present invention was carried out in the same manner as Example 2, except that the uniformization bath was not used and that the copolymer solution was filled into 20 L polyethylene containers directly from the solvent substitution bath.

Comparative Example 3

The present invention was carried out in the same manner as Example 3, except that the uniformization bath was not used and that the copolymer solution was filled into 20 L polyethylene containers directly from the solvent substitution bath.

Comparative Example 4

The present invention was carried out in the same manner as Example 4, except that the uniformization bath was not used and that the copolymer solution was filled into 20 L polyethylene containers directly from the solvent substitution bath.

TABLE 1

|  | NMR composition (mol %) | | | | | | GPC | |
| --- | --- | --- | --- | --- | --- | --- | --- | --- |
|  | N | M | O | G | A | m | Mw | Mw/Mn |
| Example 1 | 49.3 | 50.7 |  |  |  |  | 6,690 | 1.66 |
| Example 2 | 49.3 | 50.7 |  |  |  |  | 6,700 | 1.66 |
| Example 3 | 38.7 | 42.9 | 18.4 |  |  |  | 8,810 | 1.62 |
| Example 4 |  |  |  | 25.1 | 10.9 | 64 | 6,500 | 1.59 |
| Comparative Example 1 | 49.2 | 50.8 |  |  |  |  | 6,680 | 1.66 |
| Comparative Example 2 | 49.4 | 50.6 |  |  |  |  | 6,680 | 1.66 |
| Comparative Example 3 | 38.8 | 42.9 | 18.3 |  |  |  | 8,830 | 1.62 |
| Comparative Example 4 |  |  |  | 25.1 | 10.9 | 64 | 6,510 | 1.59 |

TABLE 2

|  |  | Copolymer Concentration (% by weight) | | | | | | | | Concentration |
| --- | --- | --- | --- | --- | --- | --- | --- | --- | --- | --- |
|  | Solvent Type | Container 1 | Container 2 | Container 3 | Container 4 | Container 5 | Container 6 | Container 7 | Ave | Range/Maximum Concentration |
| Example 1 | PGMEA | 24.96 | 25.05 | 25.06 | 25.05 | 25.05 | 25.07 | 25.05 | 25.04 | 0.40% |
| Example 2 | PGMEA | 24.93 | 25.05 | 25.04 | 25.03 | 25.02 | 25.06 | 25.04 | 25.03 | 0.50% |
| Example 3 | MAK | 24.91 | 25.02 | 25.04 | 25 | 25 | 25.06 | 25.02 | 25.01 | 0.60% |
| Example 4 | PGME | 24.9 | 25.01 | 25.03 | 24.99 | 24.97 | 25.04 | 24.99 | 24.99 | 0.60% |
| Comparative Example 1 | PGMEA | 24.53 | 25.01 | 25.04 | 25.05 | 25.05 | 25.06 | 25.07 | 24.97 | 2.20% |
| Comparative Example 2 | PGMEA | 24.66 | 25.05 | 25.05 | 25.08 | 25.09 | 25.09 | 25.11 | 25.02 | 1.80% |
| Comparative Example 3 | MAK | 24.49 | 24.99 | 25.01 | 25.03 | 25.02 | 25.02 | 25.02 | 24.94 | 2.20% |
| Comparative Example 4 | PGME | 24.61 | 25.05 | 25.05 | 25.05 | 25.06 | 25.09 | 25.07 | 25 | 1.90% |

TABLE 3

| | Solvent Type | Coating Film Thickness (nm) | | | | | | | | Range of Coating Film Thickness/ Maximum Coating Film Thickness |
| | | Container 1 | Container 2 | Container 3 | Container 4 | Container 5 | Container 6 | Container 7 | Ave | |
|---|---|---|---|---|---|---|---|---|---|---|
| Example 1 | PGMEA | 345 | 347 | 347 | 347 | 347 | 347 | 347 | 347 | 0.70% |
| Example 2 | PGMEA | 344 | 347 | 347 | 346 | 346 | 347 | 347 | 346 | 0.80% |
| Example 3 | MAK | 326 | 329 | 329 | 328 | 328 | 330 | 329 | 329 | 1.00% |
| Example 4 | PGME | 306 | 308 | 308 | 307 | 307 | 308 | 307 | 307 | 0.90% |
| Comparative Example 1 | PGMEA | 335 | 346 | 347 | 347 | 347 | 347 | 347 | 345 | 3.50% |
| Comparative Example 2 | PGMEA | 338 | 347 | 347 | 347 | 348 | 348 | 348 | 346 | 2.90% |
| Comparative Example 3 | MAK | 318 | 328 | 329 | 329 | 329 | 329 | 329 | 327 | 3.60% |
| Comparative Example 4 | PGME | 300 | 309 | 309 | 309 | 309 | 309 | 309 | 308 | 3.00% |

As described in the above, the method of producing according to the present invention, in which method the difference between the maximum and minimum values of the copolymer concentration among the containers is not more than 1.5% of the maximum concentration, enables any copolymer solution filled in the containers from the same production lot to be used to attain spin coating at a constant film thickness.

The invention claimed is:

1. A method for production of a copolymer solution for semiconductor lithography, said copolymer solution consisting essentially of a copolymer and a solvent for coating film formation, said copolymer containing at least one repeating unit selected from the group consisting of: a repeating unit (A) having a hydroxyl group; a repeating unit (B) having a structure in which a hydroxyl group is protected by a group which suppresses dissolution into an alkaline developer and which dissociates in the action of an acid; a repeating unit (C) having a lactone structure and a repeating unit (D) having a cyclic ether structure;

said method comprising a step (S) of heating said copolymer solution under reduced pressure to distill off impurities whose boiling points are lower than that of said solvent for coating film formation; a step (U) of stirring said copolymer solution after said step (S) using a bath different from one used in said step (S) to uniformize the concentration of the copolymer in said copolymer solution; and a step (W) of filling said copolymer solution after step (U) into a plurality of containers, wherein the difference between the maximum value and minimum value of the concentration of said copolymer between said containers is not more than 1.5% of the maximum concentration.

2. The method for production according to claim 1, further comprising a step (T) of filtering said copolymer solution, between said step (S) and said step (U).

3. The method for production according to claim 1, wherein said solvent for coating film formation is a solvent having at least one polar group selected from the group consisting of ketone bond, ester bond, ether bond and hydroxyl group, said solvent containing a solvent whose boiling point at normal pressure is 110 to 220° C.

4. The method for production according to the claim 1, wherein said copolymer further containing a repeating unit (E) having a structure which is gable against the action of an acid and suppresses said dissolution into said alkaline developer.

5. The method for production according to claim 1, wherein said repeating unit (A) has at least one selected from the group consisting of alcoholic hydroxyl group, phenolic hydroxyl group, fluoro-alcoholic hydroxyl group, carboxyl group and sulfa group.

6. The method for production according to claim 1, wherein said repeating unit (A) has at least one structure of the formula selected from the group consisting of:

Formula (A1)

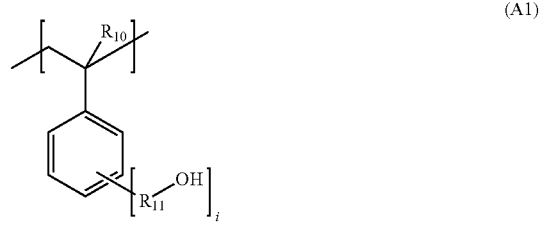

(A1)

wherein $R_{10}$ is a hydrogen atom or a $C_1$-$C_4$ hydrocarbon group which may be substituted with one or more fluorine atom; $R_{11}$ is a single bond or a $C_1$-$C_4$ bivalent hydrocarbon group which may be substituted with one or more fluorine atom and i is an integer of 1 or 2;

Formula (A2)

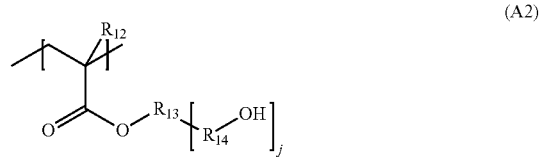

(A2)

wherein $R_{12}$ is a hydrogen atom or a $C_1$-$C_4$ hydrocarbon group which may be substituted with one or more fluorine atom; $R_{13}$ is a $C_2$-$C_{12}$ bivalent to tetravalent hydrocarbon group which may contain one or more fluorine atom, oxygen atom, or sulfur atom; $R_{14}$ is a single bond or a $C_1$-$C_4$ bivalent hydrocarbon group which may be substituted with one or more fluorine atom and j is an integer of 1 to 3; and Formula (A3)

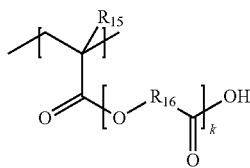

wherein $R_{15}$ is a hydrogen atom or a $C_1$-$C_4$ hydrocarbon group which may be substituted with one or more fluorine atom; $R_{16}$ is a $C_6$-$C_{12}$ bivalent alicyclic hydrocarbon group which may contain an oxygen atom or a sulfur atom; and k is an integer of 0 or 1.

7. The method for production according to claim 1, wherein said repeating unit (B) has a structure formed by protecting the hydroxyl group of the structure represented by said Formulae (A1) to (A3) with an acid-dissociable dissolution-inhibiting group represented by Formula (b1)

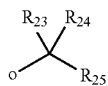

wherein o is the binding site of the Formula (b1); $R_{23}$ and $R_{24}$ are independently a $C_1$-$C_4$ hydrocarbon group; and $R_{25}$ is a $C_1$-$C_{12}$ hydrocarbon group; or $R_{25}$ may bind with $R_{23}$ or $R_{24}$ to form a ring; and/or Formula (b2)

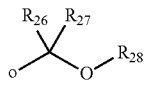

wherein o is the binding site of the Formula (b2); $R_{26}$ and $R_{27}$ are independently a $C_1$-$C_4$ hydrocarbon group; and $R_{28}$ is a $C_1$-$C_{12}$ hydrocarbon group; or $R_{26}$ may bind to $R_{27}$ or $R_{28}$ to form a ring.

8. The method for production according to claim 1, wherein said repeating unit (C) has the structure represented by Formula (C)

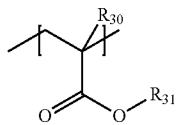

wherein $R_{30}$ is a hydrogen atom or a $C_1$-$C_4$ hydrocarbon group which may be substituted with one or more fluorine atom; and $R_{31}$ is a group containing the lactone structure, which group is represented by Formula (c)

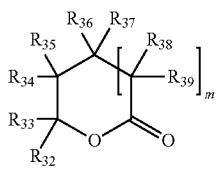

wherein any one of $R_{32}$ to $R_{39}$ represents a single bond as a binding site of $R_{31}$; and the remaining $R_{32}$ to $R_{39}$ are a hydrogen atom, a $C_1$-$C_4$ hydrocarbon group or a $C_1$-$C_4$ alkoxy group; or any one of $R_{32}$ to $R_{39}$ is a $C_3$-$C_{14}$ hydrocarbon group having a binding site as $R_{31}$ and forming a $C_5$-$C_{15}$ alicyclic structure by binding to any one or two of other $R_{32}$ to $R_{39}$, which may contains an oxygen atom or a sulfur atom; one or two of the remaining $R_{32}$ to $R_{39}$ is a single bond to form said $C_5$-$C_{15}$ alicyclic structure; and the remainder is a hydrogen atom, a $C_1$-$C_4$ hydrocarbon group or a $C_1$-$C_4$ alkoxy group; and m represents an integer of 0 or 1.

9. The method for production according to claim 1, wherein said repeating unit (D) has the structure represented by Formula (D)

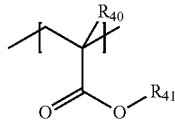

wherein $R_{40}$ is a hydrogen atom or a $C_1$-$C_4$ hydrocarbon group which may be substituted with one or more fluorine atom; and $R_{41}$ is a $C_3$-$C_7$ hydrocarbon group containing a 3- to 6-membered cyclic ether structure.

10. The method for production according to claim 6, wherein said repeating unit (E) has at least one structure selected from the group consisting of a structure (E1), structure (E2), structure (E3), all of in which the hydrogen atom of the hydroxyl group in the structure represented by said Formula (A1), said Formula (A2), and said Formula (A3), respectively, is substituted with an acid-stable dissolution-inhibiting group, and a structure of the Formula (E4)

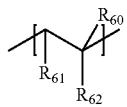

wherein $R_{60}$ is a hydrogen atom or a $C_1$-$C_4$ hydrocarbon group which may be substituted with one or more fluorine atom; $R_{61}$ is a hydrogen atom, a single bond linking to $R_{62}$ or a $C_1$-$C_4$ hydrocarbon group; and $R_{62}$ is a $C_6$-$C_{14}$ aromatic hydrocarbon group.

11. The method for production according to claim 1, wherein the stirring in step (U) is conducted for a stirring time in the range of 1-360 minutes and at a stirring speed in the range of 5-500 rpm.

* * * * *

UNITED STATES PATENT AND TRADEMARK OFFICE
CERTIFICATE OF CORRECTION

PATENT NO. : 8,377,625 B2  
APPLICATION NO. : 12/607324  
DATED : February 19, 2013  
INVENTOR(S) : Takanori Yamagishi et al.

Page 1 of 1

It is certified that error appears in the above-identified patent and that said Letters Patent is hereby corrected as shown below:

In the Claims

Column 61, line 65

(claim 4, line 3): Please change "gable" to -- stable --

Column 62, line 24

(claim 5, line 5): Please change "sulfa" to -- sulfo --

Signed and Sealed this
Fourth Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO.         : 8,377,625 B2
APPLICATION NO.    : 12/607324
DATED              : February 19, 2013
INVENTOR(S)        : Takanori Yamagishi et al.

It is certified that error appears in the above-identified patent and that said Letters Patent is hereby corrected as shown below:

In the Claims

Column 63, line 36

(claim 7, line 19): Please delete the phrase "Formula (b2)"

Signed and Sealed this
Twenty-sixth Day of November, 2013

Margaret A. Focarino
*Commissioner for Patents of the United States Patent and Trademark Office*